(12) United States Patent
Chung et al.

(10) Patent No.: US 8,866,859 B2
(45) Date of Patent: Oct. 21, 2014

(54) DISPLAY DEVICE, SCAN DRIVER FOR A DISPLAY DEVICE, AND A DRIVING METHOD THEREOF

(75) Inventors: Bo-Yong Chung, Yongin (KR);
Dong-Beom Lee, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 319 days.

(21) Appl. No.: 13/242,435

(22) Filed: Sep. 23, 2011

(65) Prior Publication Data
US 2012/0139962 A1    Jun. 7, 2012

(30) Foreign Application Priority Data

Dec. 6, 2010    (KR) .................. 10-2010-0123778

(51) Int. Cl.
*G09G 5/10*    (2006.01)
*G11C 19/18*    (2006.01)
*G09G 3/20*    (2006.01)
*G09G 3/32*    (2006.01)

(52) U.S. Cl.
CPC ............ *G09G 3/3266* (2013.01); *G11C 19/184* (2013.01); *G09G 3/20* (2013.01); *G09G 2310/06* (2013.01); *G09G 2310/0267* (2013.01); *G09G 2300/0861* (2013.01); *G09G 2310/0286* (2013.01)
USPC ................. 345/690; 345/76; 345/77; 345/99; 345/82; 345/83; 345/204; 377/76

(58) Field of Classification Search
CPC ....... G11C 19/28; G09G 3/3677; G09G 3/20; G09G 3/3266; G09G 2310/0286
USPC .................. 345/76–77, 81–83, 204, 690, 99; 377/76
See application file for complete search history.

(56) References Cited

U.S. PATENT DOCUMENTS

| | | | | |
|---|---|---|---|---|
| 7,317,779 | B2 * | 1/2008 | Moon et al. ..................... | 377/64 |
| 7,436,923 | B2 * | 10/2008 | Tobita ............................. | 377/64 |
| 7,492,853 | B2 * | 2/2009 | Tobita ............................. | 377/64 |
| 7,646,841 | B2 * | 1/2010 | Moon et al. ..................... | 377/64 |
| 7,714,817 | B2 * | 5/2010 | Park et al. ....................... | 345/82 |
| 7,873,140 | B2 * | 1/2011 | Moon et al. ..................... | 377/76 |
| 7,880,714 | B2 * | 2/2011 | Jang et al. ..................... | 345/100 |
| 8,004,477 | B2 * | 8/2011 | Uchino et al. .................. | 345/76 |
| 8,031,141 | B2 * | 10/2011 | Shin ................................ | 345/76 |
| 8,041,000 | B2 * | 10/2011 | Moon et al. ..................... | 377/64 |
| 8,094,142 | B2 * | 1/2012 | Park ............................... | 345/204 |

(Continued)

FOREIGN PATENT DOCUMENTS

| | | |
|---|---|---|
| KR | 10-2007-0022550 A | 2/2007 |
| KR | 10-2008-0090954 A | 10/2008 |
| KR | 10-2008-0095799 A | 10/2008 |
| KR | 10-2009-0051603 A | 5/2009 |

*Primary Examiner* — Lun-Yi Lao
*Assistant Examiner* — Peter D McLoone
(74) *Attorney, Agent, or Firm* — Lee & Morse, P.C.

(57) ABSTRACT

A scan driver may include: a first scan driving block, outputting a second clock signal to a first output terminal according to an input signal, in synchronization with a first clock signal; and a second scan driving block, outputting the first clock signal according to the output signal of the first scan driving block to a second output terminal, in synchronization with the second clock signal, wherein the first scan driving block and the second scan driving block simultaneously output an entire clock signal, according to a level of a simultaneous light emission control signal.

30 Claims, 13 Drawing Sheets

(56) References Cited

U.S. PATENT DOCUMENTS

| | | | |
|---|---|---|---|
| 8,102,340 B2* | 1/2012 | Lee et al. | 345/87 |
| 8,164,559 B2* | 4/2012 | Lee et al. | 345/98 |
| 8,194,026 B2* | 6/2012 | Lee et al. | 345/100 |
| 8,199,080 B2* | 6/2012 | Okamoto et al. | 345/77 |
| 8,253,661 B2* | 8/2012 | Sun et al. | 345/77 |
| 8,325,127 B2* | 12/2012 | Chang et al. | 345/100 |
| 8,432,388 B2* | 4/2013 | Koh | 345/211 |
| 8,466,905 B2* | 6/2013 | Chung | 345/204 |
| 8,582,715 B2* | 11/2013 | Chung et al. | 377/74 |
| 2004/0165692 A1* | 8/2004 | Moon et al. | 377/64 |
| 2004/0207614 A1* | 10/2004 | Yamashita et al. | 345/211 |
| 2006/0017686 A1* | 1/2006 | Park | 345/100 |
| 2006/0238482 A1* | 10/2006 | Jang et al. | 345/100 |
| 2007/0001937 A1* | 1/2007 | Park et al. | 345/76 |
| 2007/0115225 A1* | 5/2007 | Uchino et al. | 345/76 |
| 2007/0177438 A1* | 8/2007 | Moon et al. | 365/189.12 |
| 2007/0217564 A1* | 9/2007 | Tobita | 377/64 |
| 2007/0240024 A1* | 10/2007 | Shin | 714/726 |
| 2008/0036725 A1* | 2/2008 | Lee et al. | 345/100 |
| 2008/0219401 A1* | 9/2008 | Tobita | 377/79 |
| 2008/0284698 A1* | 11/2008 | Lee et al. | 345/87 |
| 2009/0033651 A1* | 2/2009 | Okamoto et al. | 345/214 |
| 2009/0128476 A1* | 5/2009 | Lee et al. | 345/98 |
| 2009/0141051 A1* | 6/2009 | Sun et al. | 345/690 |
| 2010/0158186 A1* | 6/2010 | Moon et al. | 377/76 |
| 2010/0158187 A1* | 6/2010 | Moon et al. | 377/76 |
| 2011/0279430 A1* | 11/2011 | Koh | 345/211 |
| 2011/0316833 A1* | 12/2011 | Chang et al. | 345/211 |
| 2012/0013588 A1* | 1/2012 | Chung | 345/211 |
| 2012/0105423 A1* | 5/2012 | Chung | 345/212 |
| 2013/0002307 A1* | 1/2013 | Choi et al. | 327/108 |
| 2013/0002340 A1* | 1/2013 | Chung et al. | 327/434 |
| 2013/0120326 A1* | 5/2013 | Chung et al. | 345/204 |
| 2013/0127807 A1* | 5/2013 | Kim et al. | 345/211 |
| 2013/0285888 A1* | 10/2013 | Chung et al. | 345/55 |
| 2013/0321644 A1* | 12/2013 | Chung et al. | 348/184 |

* cited by examiner

DISPLAY DEVICE, SCAN DRIVER FOR A DISPLAY DEVICE, AND A DRIVING METHOD THEREOF

RELATED APPLICATION

This application claims priority to and the benefit of Korean Patent Application No. 10-2010-0123778 filed in the Korean Intellectual Property Office on Dec. 6, 2010, the entire contents of which are incorporated herein by reference.

BACKGROUND

1. Field

Embodiments relate to a display device, a scan driver for the display device, and a driving method thereof. More particularly, embodiments relate to a display device capable of being driven with sequential driving and simultaneous driving of a scan signal, a scan driver for the display device, and a driving method thereof.

2. Description of the Related Art

A variety of flat panel displays that can reduce weight and volume have been developed. Weight and volume are drawbacks of cathode ray tubes. Flat panel displays include liquid crystal displays (LCDs), field emission displays (FEDs), plasma display panels (PDPs), and organic light emitting diode (OLEDs) displays.

A flat panel display includes a display panel consisting of a plurality of pixels arranged in a matrix format. The display panel includes a plurality of scan lines in a row direction and a plurality of data lines in a column direction, and the plurality of scan lines and the plurality of data lines intersect. The plurality of pixels are driven by scan signals and data signals transmitted through the corresponding scan lines and data lines.

The disclosed information in the Background is only for enhancing an understanding of the described technology. Therefore, it may contain information that does not form the prior art that is already known to a person of ordinary skill in the art in this country.

SUMMARY

Present embodiments may be directed to a display device, a scan driver for the display device, and a driving method thereof.

A scan driver, according to an exemplary embodiment, may include: a first scan driving block, outputting a second clock signal to a first output terminal according to an input signal, in synchronization with a first clock signal; and a second scan driving block, outputting the first clock signal according to the output signal of the first scan driving block to a second output terminal, in synchronization with the second clock signal, wherein the first scan driving block and the second scan driving block simultaneously output an entire clock signal, according to a level of a simultaneous light emission control signal.

When the simultaneous light emission control signal is applied as a gate-on voltage, the first scan driving block and the second scan driving block may simultaneously output the entire clock signal.

When the simultaneous light emission control signal is applied as the gate-on voltage, the first clock signal and the second clock signal may be applied as a gate-off voltage.

When the simultaneous light emission control signal is applied as a gate-off voltage, the first scan driving block may output the second clock signal to the first output terminal and the second scan driving block may output the first clock signal to the second output terminal.

The first scan driving block may output the scan signal of the gate-on voltage to the first output terminal by a duty of the second clock signal, and the second scan driving block may output the scan signal of the gate-on voltage to the second output terminal by the duty of the first clock signal.

The second clock signal may be a signal which is shifted by the duty of the first clock signal.

The second clock signal may be a signal in which the first clock signal is shifted by 1 horizontal cycle.

The second clock signal may be a signal in which the first clock signal is shifted by 2 horizontal cycles.

The input signal of the first scan driving block may be an output signal of a scan start signal or a previous scan driving block.

A scan driver, according to another exemplary embodiment, may include: a plurality of scan driving blocks, wherein each scan driving block of the plurality of scan driving blocks includes: a sequential driver sequentially outputting a scan signal through a first output terminal; and a simultaneous driver simultaneously outputting an entire clock signal through a second output terminal according to a level of a simultaneous light emission control signal, and the sequential driver includes: a first transistor transmitting a first power source voltage to the first output terminal; a second transistor turned on by an input signal transmitted by a first signal input to a first clock signal input terminal, to transmit a second signal input to a second clock signal input terminal to the first output terminal; a third transistor turned on by the first signal, to transmit the input signal to a gate electrode of the second transistor; and a fourth transistor turned on by the first clock signal, to transmit a second power source voltage to a gate electrode of the first transistor.

The sequential driver further may include a first capacitor storing the gate voltage of the second transistor.

The sequential driver may further include a fifth transistor, turning off the first transistor when the second signal is output to the first output terminal as a logic low level voltage, such that the first power source voltage is not transmitted to the output terminal.

The sequential driver may further include a sixth transistor, turning off the second transistor, when the entire clock signal is output to the first output terminal, such that the second signal is not transmitted to the first output terminal.

The simultaneous driver may include a seventh transistor, for the entire clock signal to not be transmitted to the output terminal, when the second signal is transmitted to the second output terminal; an eighth transistor transmitting the entire clock signal to the second output terminal; and a ninth transistor, turned on by the simultaneous light emission control signal, to turn on the eighth transistor.

The simultaneous driver may further include a second capacitor, storing a gate-on voltage and a gate-off voltage of the eighth transistor.

The seventh transistor may be turned on by the second signal, to transmit the first power source voltage to a gate electrode of the eighth transistor, such that the eighth transistor may be turned off.

The seventh transistor may be turned on by the first signal, to transmit the first power source voltage to a gate electrode of the eighth transistor, such that the eighth transistor may be turned off.

The ninth transistor may be turned on by the simultaneous light emission control signal, to transmit the second power source voltage to a gate electrode of the eighth transistor, such that the eighth transistor may be turned on.

The ninth transistor may be turned on by the simultaneous light emission control signal, to transmit the simultaneous light emission control signal to a gate electrode of the eighth transistor, such that the eighth transistor may be turned on.

The sequential driver may further include a tenth transistor, turned on by the simultaneous light emission control signal when the entire clock signal is output to the output terminal, to apply a power source voltage VGH to the gate electrode of the first transistor, such that the first transistor is turned off.

A plurality of scan driving blocks, including the sequential driver and the simultaneous driver may be further included.

The input signal may be a scan start signal or an output signal of the previous scan driving block.

The plurality of scan driving blocks may include a first scan driving block and a second scan driving block, a first scan signal input terminal of the first scan driving block may be input with the first clock signal, a second scan signal input terminal is input with the second clock signal, a first scan signal input terminal of the second scan driving block may be input with the second clock signal, and a second scan signal input terminal may be input with the first clock signal.

The second clock signal may be the signal for the first clock signal, shifted by 1 horizontal cycle.

The first scan driving block may output the scan signal of a gate-on voltage by a duty of the second clock signal, and the second scan driving block may output the scan signal of a gate-on voltage by a duty of the first clock signal.

A display device, according to another exemplary embodiment, may include: a display unit including a plurality of pixels; a data driver applying a data signal to a plurality of data lines connected to the plurality of pixels; and a scan driver applying a scan signal to a plurality of scan lines connected to the plurality of pixels to apply the data signal to the plurality of pixels, wherein the scan driver includes a plurality of scan driving blocks sequentially outputting the scan signal to a plurality of scan lines in synchronization with a first clock signal, and simultaneously outputting the scan signal to the plurality of scan lines according to a level of a simultaneous light emission control signal, wherein a first scan driving block, among the plurality of scan driving blocks, outputs a second clock signal as the first scan signal, according to an input signal in synchronization with the first clock signal, and a second scan driving block, adjacent to the first scan driving block, outputs the first clock signal as the second scan signal, according to the first scan signal in synchronization with the second clock signal.

The input signal may be a scan start signal or an output signal of a previous scan driving block.

When the first clock signal and the second clock signal are applied as a gate-off voltage and the simultaneous light emission control signal is applied as a gate-on voltage, the scan driver may simultaneously output the scan signal to the plurality of scan lines.

When the first clock signal and the second clock signal are applied as the signal having a predetermined duty and the simultaneous light emission control signal is applied as a gate-off voltage, the scan driver sequentially may output the scan signal to the plurality of scan lines.

A method of driving a scan driver, including a plurality of scan driving blocks, according to another exemplary embodiment, may include: outputting, simultaneously, scan signals in a plurality of scan driving blocks by applying a first clock signal and a second clock signal as a gate-off voltage and applying a simultaneous light emission control signal as a gate-on voltage to the plurality of scan driving blocks; and outputting, sequentially, scan signals in the plurality of scan driving blocks by applying a simultaneous light emission control signal as the gate-off voltage and applying the first clock signal and the second clock signal having a predetermined duty to the plurality of scan driving blocks, wherein the outputting, sequentially, of the scan signal includes outputting the second clock signal, having the predetermined duty, as a first scan signal according to an input signal, in synchronization with the first clock signal having the predetermined duty; and outputting the first clock signal, having the predetermined duty, as a second scan signal according to the first scan signal, in synchronization with the second clock signal having the predetermined duty.

The input signal may be a scan start signal or an output signal of a previous scan driving block.

The second clock signal having the predetermined duty, may be the signal for the first clock signal having the predetermined duty, to be shifted by the predetermined duty of the first clock signal.

DETAILED DESCRIPTION

Figure 1:
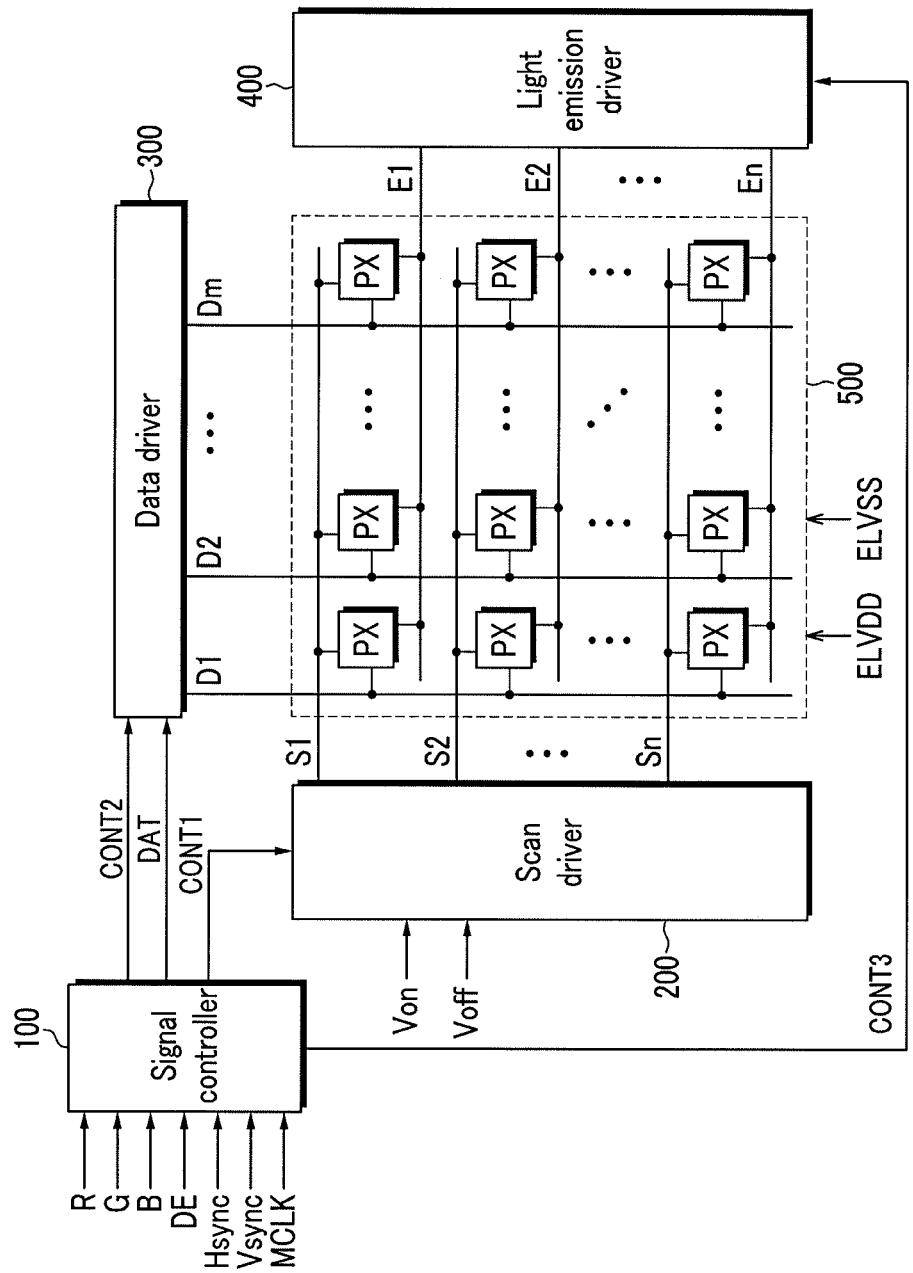
FIG. 1 is a block diagram of a display device according to an exemplary embodiment.

Korean Patent Application No. 10-2010-0123778, filed on Dec. 6, 2010, in the Korean Intellectual Property Office, and entitled: "Display Device and Scan Driver for a Display Device, and a Driving Method Thereof," is incorporated by reference herein in its entirety.

Present embodiments will now be described more fully hereinafter with reference to the accompanying drawings, in which exemplary embodiments of the inventive concept are illustrated. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

Since sizes and thicknesses of constituent members shown in the accompanying drawings are arbitrarily given for better understanding and ease of description, present embodiments are not limited to the illustrated sizes and thicknesses.

In order to clarify present embodiments, elements extrinsic to the description are omitted, and like reference numerals refer to like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising" will be understood to imply the inclusion of stated elements but not the exclusion of any other elements.

FIG. 1 is a block diagram of a display device according to an exemplary embodiment.

Referring to FIG. 1, a display device includes a signal controller 100, a scan driver 200, a data driver 300, a light emission driver 400, and a display unit 500.

The signal controller 100 receives video signals (R, G, B) that are inputted from an external device and an input control signal that controls displaying thereof. The video signals (R, G, B) include luminance of each pixel PX, and the luminance has a grayscale having a predetermined number, for example, $1024=2^{10}$, $256=2^8$, or $64=2^6$. As examples of the input control signals, there are a vertical synchronization signal Vsync, a horizontal synchronization signal Hsync, a main clock signal MCLK, and a data enable signal DE.

The signal controller 100 appropriately processes the input video signals (R, G, B) according to the operation conditions of the display unit 500 and the data driver 300 on the basis of the input video signals (R, G, B) and the input control signal, and generates a scan control signal CONT1, a data control signal CONT2, an image data signal DAT, and a light emission control signal CONT3. The signal controller 100 transmits the scan control signal CONT1 to the scan driver 200. The signal controller 100 transmits the data control signal CONT2 and image data signal DAT to the data driver 300. The signal controller 100 transmits the light emission control signal CONT3 to the light emission driver 400.

The display unit 500 includes a plurality of scan lines S1-Sn, a plurality of data lines D1-Dm, a plurality of light emitting lines E1-En, and a plurality of pixels PX connected to a plurality of signal lines S1-Sn, D1-Dm, and E1-En arranged in an approximate matrix form. The plurality of scan lines S1-Sn are extended in a row direction and are in parallel with each other. The plurality of data lines D1-Dm are extended in a column direction and are in parallel with each other. The plurality of light emitting lines E1-En respectively corresponding to the scan lines S1-Sn are extended in a row direction. A plurality of pixels PX of the display unit 500 receive the first power source voltage ELVDD and the second power source voltage ELVSS from the outside.

The scan driver 200 is connected to a plurality of scan lines S1-Sn, and applies scan signals that include a combination of a gate-on voltage Von that turns on the switching transistor (referring to M1 of FIG. 2) and a gate-off voltage Voff that turns it off to the plurality of scan lines S1-Sn according to the scan control signal CONT1. The scan driver 200 applies the scan signal to the plurality of scan lines S1-Sn such that the data signal is applied to the plurality of pixels PX. The scan driver 200 may execute sequential driving by sequentially applying the scan signal to a plurality of scan lines S1-Sn and simultaneous driving by simultaneously applying the scan signal.

The scan control signal CONT1 includes a scan start signal SSP, a plurality of clock signals SCLK1 and SCLK2, a simultaneous light emission control signal CSP, and an entire clock signal SGCK. The scan start signal SSP is a signal generating a first scan signal to display images of one frame. A plurality of clock signals SCLK1 and SCLK2 are synchronization signals generating the scan signal in each of the scan lines S1-Sn. The simultaneous light emission control signal CSP and the entire clock signal SGCK are signals for controlling the sequential driving and the simultaneous driving of the scan driver 200.

The data driver 300 is connected to a plurality of data lines D1-Dm, and selects a data voltage according to the image data signal DAT. The data driver 300 applies the selected data voltage as the data signal to a plurality of data lines D1-Dm according to the data control signal CONT2.

The light emission driver 400 is connected to a plurality of light emitting lines E1-En, and applies the light emitting signal that includes a combination of a gate-on voltage Von that turns on the light emitting transistor (referring to M3 of FIG. 2) and a gate-off voltage Voff that turns it off to the plurality of light emitting lines E1-En according to the light emission control signal CONT3.

The organic light emitting diode (OLED) display may be driven by including the scan period for applying a data signal to the plurality of pixels PX included in the display unit 500, and a sustain period for emitting all pixels PX. The light emission driver 400 applies the gate-off voltage to the plurality of light emitting lines E1-En in the scan period, and the gate-on voltage to the plurality of light emitting lines E1-En in the sustain period.

Each driving device 100, 200, 300, and 400 may be directly mounted on the display unit 400 in the form of at least one integrated circuit chip, mounted on a flexible printed circuit film, attached to the display unit 500 in the form of a tape carrier package (TCP), or mounted on a separate printed circuit board (PCB). Alternatively, they may be integrated in the display unit 500 together with the signal lines S1-Sn, D1-Dm, and E1-En.

Figure 2:
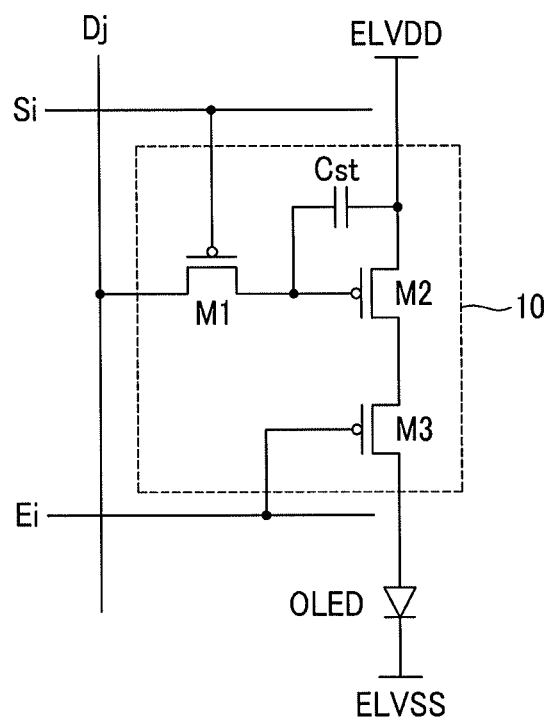
FIG. 2 is a circuit diagram of one example of the pixel of the display device of FIG. 1.

FIG. 2 is a circuit diagram showing a pixel according to an exemplary embodiment.

Referring to FIG. 2, the pixel PX of the organic light emitting diode (OLED) display includes the organic light emitting diode (OLED) and a pixel circuit 10 to control the organic light emitting diode (OLED). The pixel circuit 10 includes a switching transistor M1, a driving transistor M2, a light emitting transistor M3, and a storage capacitor Cst.

The switching transistor M1 includes a gate electrode connected to the scan line Si, one terminal connected to the data line Dj, and the other terminal connected to the gate electrode of the driving transistor M2.

The driving transistor M2 includes a gate electrode connected to the other terminal of the switching transistor M1, one terminal connected to the ELVDD power source, and the other terminal connected to one terminal of the light emitting transistor M3.

The light emitting transistor M3 includes a gate electrode connected to the light emitting line Ei, one terminal connected to the other terminal of the driving transistor M2, and the other terminal connected to the anode of the organic light emitting diode (OLED).

The storage capacitor Cst includes one terminal connected to the gate electrode of the driving transistor M1 and the other terminal connected to one terminal of the driving transistor M1. The storage capacitor Cst charges the data voltage applied to the gate electrode of the driving transistor M2, and it is maintained after the switching transistor M1 is turned off.

The organic light emitting diode (OLED) includes an anode connected to the other terminal of the light emitting transistor M3 and a cathode connected to the power source ELVSS.

The switching transistor M1, the driving transistor M2, and the light emitting transistor M3 may be p-channel field effect transistors. The gate-on voltage turning on the switching transistor M1, the driving transistor M2, and the light emitting transistor M3 is a logic low level voltage, and the gate-off voltage turning it off is a logic high level voltage.

The transistors are p-channel field effect transistors. However at least one of the switching transistor M1, the driving transistor M2, and the light emitting transistor M3 may be an n-channel field effect transistor. The gate-on voltage for turning on the n-channel electric field effect transistor is the logic high voltage and the gate-off voltage for turning it off is the logic low voltage.

When the gate-on voltage Von is applied to the scan line Si, the switching transistor M1 is turned on, and a data signal applied to the data line Dj is applied to one terminal of the sustain capacitor Cst through the turned-on switching transistor M1 to charge the sustain capacitor Cst. The driving transistor M2 controls the amount of current flowing from the power source ELVDD to the organic light emitting diode (OLED) corresponding to a voltage value charged in the storage capacitor Cst. When the gate-on voltage is applied to the light emitting line Ei, the light emitting transistor M3 is turned on, and the current flowing from the power source ELVDD to the driving transistor M2 flows to the organic light emitting diode (OLED). The organic light emitting diode (OLED) generates light corresponding to the amount of current flowing through the driving transistor M2.

The organic light emitting diode (OLED) may emit light of one of primary colors. The primary colors include, for example, red, green, and blue. A desired color is displayed with a spatial or temporal sum of the three primary colors. In this case, the organic light emitting diode (OLED) may partially emit white light, and accordingly luminance is increased. Alternatively, the organic light emitting diodes (OLEDs) of all pixels PX may emit white light, and some of the pixels PX may further include a color filter (not shown) that changes white light emitted from the organic light emitting diodes (OLEDs) to light of one of the primary colors.

As described above, the display device includes the light emission driver 400 such that the organic light emitting diode (OLED) included in a plurality of pixels emits the light according to the light emitting signal. However, the organic light emitting diode (OLED) included in a plurality of pixels may emit the light by controlling the level of the first power source voltage ELVDD without the light emitting signal. The display device may not include the light emission driver 400, and may include a power supply unit controlling the level of the first power source voltage ELVDD. The above-described configuration of the pixel is only one example. The display device may include pixels of various configurations.

The display device may be driven with the simultaneous light emitting method, using a frame including the scan period for writing the data signal to a plurality of pixels PX and a light emitting period for emitting the light, according to the data signal written to the plurality of pixels PX.

Figure 3:
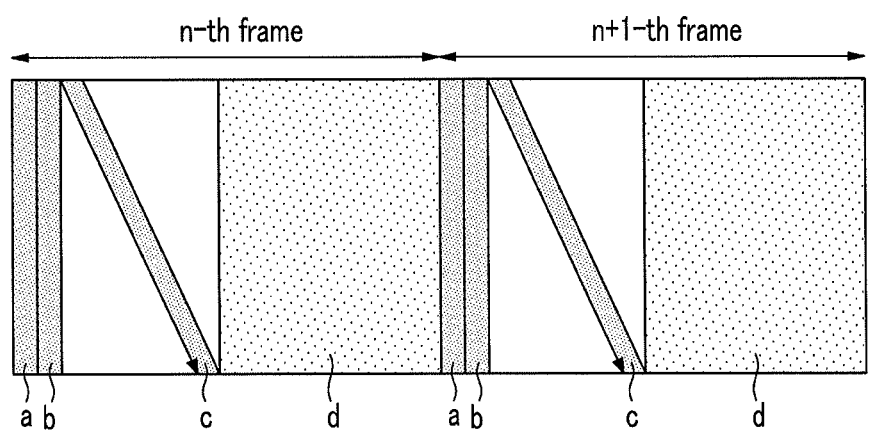
FIG. 3 is a view showing a driving operation of a simultaneous light emitting method of a display device according to an exemplary embodiment.

FIG. 3 is a view showing a driving operation of a simultaneous light emitting method of a display device according to an exemplary embodiment.

Referring to FIG. 3, the driving method of the display device includes a reset step (a) for resetting the driving voltage of the organic light emitting diode (OLED) in the pixel, a threshold voltage compensation step (b) for compensating the threshold voltage of the driving transistor of the pixel, a scan step (c) for transmitting the data signals to the plurality of pixels, and a light emitting step (d) in which the organic light emitting diode (OLED) of each pixel emits light corresponding to the transmitted data signals. In the reset step, if the cathode of the organic light emitting diode (OLED) is fixed as a predetermined voltage, the anode voltage of the organic light emitting diode (OLED) is set as a 0V voltage.

As shown, the scan step (c) is sequentially executed for each scan line. However, the reset step (a), the threshold voltage compensation step (b), and the light emitting step (d) are simultaneously executed in the entire display unit 500.

The scan driver 200 of the display device sequentially applies the scan signal of the gate-on voltage Von to a plurality of scan lines S1-Sn in the scan step (c), and simultaneously applies the scan signal of the gate-on voltage Von to a plurality of scan lines S1-Sn in the reset step (a) and in the threshold voltage compensation step (b). The scan driver 200 executes the sequential application and the simultaneous application of the scan signal according to the driving step of the display device.

The scan driver 200 executing the sequential driving sequentially for applying the scan signals to a plurality of scan line S1-Sn and the simultaneous driving for simultaneously applying the scan signals to the plurality of scan line S1-Sn will be described.

Figure 4:
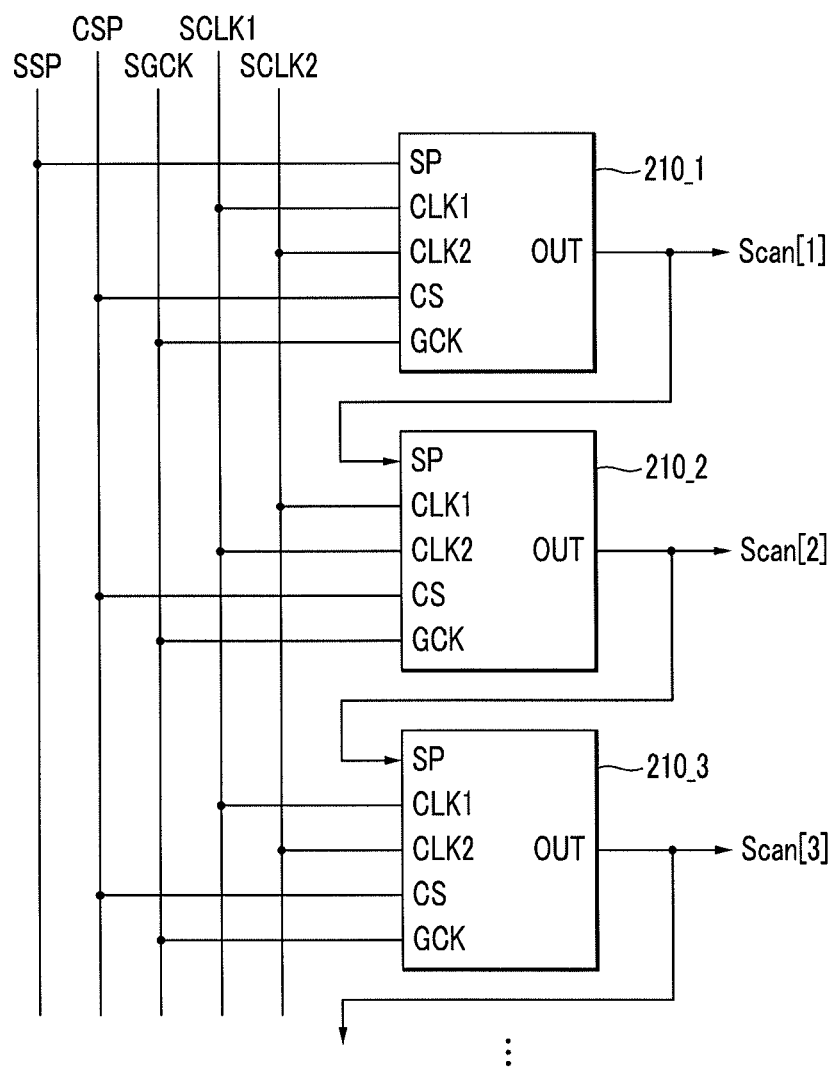
FIG. 4 is a block diagram of a configuration of a scan driver according to an exemplary embodiment.

FIG. 4 is a block diagram showing a configuration of a scan driver according to an exemplary embodiment.

Referring to FIG. 4, the scan driver includes a plurality of scan driving blocks 210_1, 210_2, 210_3, . . . generating a plurality of scan signals. Each of the scan driving blocks 210_1, 210_2, 210_3, . . . receives the input signal to generate the scan signals Scan[1], Scan[2], Scan[3], . . . transmitted to the plurality of scan lines S1-Sn.

Each of the scan driving blocks 210_1, 210_2, 210_3, . . . includes a scan start signal input terminal SP, a first clock signal input terminal CLK1, a second clock signal input terminal CLK2, a simultaneous light emission control signal input terminal CS, an entire clock signal input terminal GCK, and an output terminal OUT.

The input signal of each of the scan driving blocks 210_1, 210_2, 210_3, . . . includes a scan start signal SSP, a simultaneous light emission control signal CSP, an entire clock signal SGCK, the first clock signal SCLK1, and the second clock signal SCLK2. Each input signal is applied through different wires.

The scan start signal SSP is applied to the scan start signal input terminal SP of the first scan driving block 210_1. The scan start signal input terminal SP of the scan driving blocks 210_2, 210_3, . . . after the first scan driving block 210_1 is input with the scan signal output from the output terminal OUT of the previous scan driving block.

The simultaneous light emission control signal CSP is applied to the simultaneous light emission control signal input terminal CS of each of the scan driving blocks 210_1, 210_2, 210_3, . . . . The entire clock signal SGCK is applied to the entire clock signal input terminal GCK of each scan driving blocks 210_1, 210_2, 210_3, . . . .

The first clock signal SCLK1 and the second clock signal SCLK2 are applied to the different clock signal input terminals in two adjacent scan driving blocks. For example, the first clock signal input terminal CLK1 is connected to the wire of the first clock signal SCLK1 in the first scan driving block 210_1, and the second clock signal input terminal CLK2 is connected to the wire of the second clock signal SCLK2. In second scan driving block 210_2, the first clock signal input terminal CLK1 is connected to the wire of the second clock signal SCLK2, and the second clock signal input terminal CLK2 is connected to the wire of the first clock signal SCLK1. Two clock signals SCLK1 and SCLK2 are input to the clock signal input terminals CLK1 and CLK2 of a plurality of scan driving blocks 210_1, 210_2, 210_3, . . . with two types.

Each of the scan driving blocks 210_1, 210_2, 210_3, . . . outputs the scan signal Scan[1], Scan[2], Scan[3], . . . that are generated according to the signals input to the scan start signal input terminal SP, the first clock signal input terminal CLK1, the second clock signal input terminal CLK2, the simultaneous light emission control signal input terminal CS, and the entire clock signal input terminal GCK to the output terminal OUT.

Among the plurality of scan driving blocks 210_1, 210_2, 210_3, . . . , the first scan driving block outputs the second clock signal to the first output terminal according to the input signal in synchronization with the first clock signal, and the second scan driving block outputs the first clock signal to the second output terminal according to the output signal of the first scan driving block in synchronization with the second clock signal. The input signal of the first scan driving block may be the scan start signal SSP or the output signal of the scan driving block that is previously disposed.

The plurality of scan driving blocks 210_1, 210_2, 210_3, . . . may sequentially output or simultaneously output the scan signals Scan[1], Scan[2], Scan[3], . . . according to the level of the simultaneous light emission control signal CSP and the entire clock signal SGCK. For example, if the simultaneous light emission control signal CSP and the entire clock signal SGCK are applied as the gate-off voltage, the plurality of scan driving blocks 210_1, 210_2, 210_3, . . . sequentially output the scan signals Scan[1], Scan[2], Scan [3], . . . . If the simultaneous light emission control signal CSP and the entire clock signal SGCK are applied as the gate-on voltage, the plurality of scan driving blocks 210_1, 210_2, 210_3, . . . simultaneously output the scan signal Scan[1], Scan[2], Scan[3], . . . .

Figure 5:
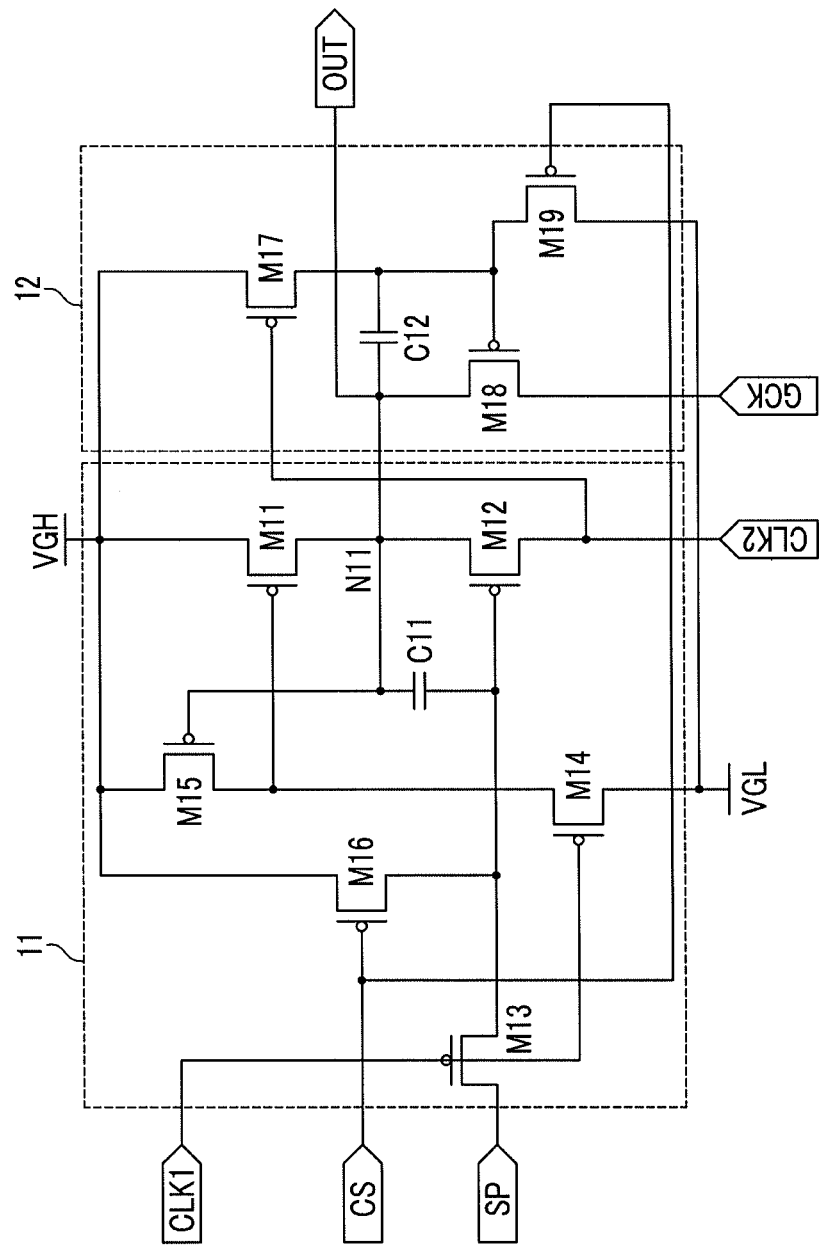
FIG. 5 is a circuit diagram of the scan driving block included in the scan driver of FIG. 4.

FIG. 5 is a circuit diagram showing the scan driving block included in the scan driver of FIG. 4 according to an embodiment.

Referring to FIG. 5, the scan driving block includes a sequential driver 11 for the scan signal to be sequentially output as the plurality of scan driving blocks 210_1, 210_2, 210_3, . . . and a simultaneous driver 12 for the scan signal to be simultaneously output as the plurality of scan driving blocks 210_1, 210_2, 210_3, . . . according to the level of the light emission control signal CSP.

The sequential driver 11 includes a plurality of transistors M11, M12, M13, M14, M15, and M16, and a first capacitor C11. The simultaneous driver 12 includes a plurality of transistors M17, M18, and M19, and a second capacitor C12.

A power source VGH is a power source having a voltage of a logic high level, and a power source VGL is a power source having a voltage of a logic low level.

The first transistor M11 includes a gate electrode connected to a first terminal of the fourth transistor M14 and a second terminal of the fifth transistor M15, a first terminal connected to the power source VGH, and a second terminal connected to the first node N11.

The second transistor M12 includes a gate electrode connected to a second terminal of the third transistor M13, a second terminal connected to the second clock signal input terminal CLK2, and a first terminal connected to a first node N11.

The third transistor M13 includes a gate electrode connected to the first clock signal input terminal CLK1, a first terminal connected to the scan start signal input terminal SP, and a second terminal connected to the gate electrode of the second transistor M12.

The fourth transistor M14 includes a gate electrode connected to the first clock signal input terminal CLK1, a second terminal connected to the power source VGL, and a first terminal connected to the gate electrode of the first transistor M11.

The fifth transistor M15 includes a gate electrode connected to the first node N11, a first terminal connected to the power source VGH, and a second terminal connected to the gate electrode of the first transistor M11.

The sixth transistor M16 includes a gate electrode connected to the simultaneous light emission control signal input terminal CS, a first terminal connected to the power source VGH, and a second terminal connected to the gate electrode of the second transistor M12.

The first capacitor C11 includes a first terminal connected to the first node N11 and a second termini connected to the gate electrode of the second transistor M12.

The first transistor M11 transmits the logic high level voltage of the power source VGH to the output terminal OUT. The second transistor M12 is turned on by the signal input to the scan start signal input terminal SP such that the second clock signal SCLK2 is transmitted to the output terminal OUT. The third transistor M13 is turned on by the signal input to the first clock signal input terminal CLK1 such that the signal input to the scan start signal input terminal SP is transmitted to the gate electrode of the second transistor M12. The fourth transistor M14 is turned on by the signal input to the first clock signal input terminal CLK1 such that the logic low level voltage of the power source VGL is transmitted to the gate electrode of the first transistor M11. The fifth transistor M15 turns off the first transistor Mil when the second clock signal SCLK2 of the voltage of the logic low level is output to the output terminal OUT such that the voltage of the logic high level of the power source VGH is not transmitted to the output terminal OUT. The sixth transistor M16 turns off the second transistor M12 when the scan signal is to be simultaneously output from a plurality of scan driving blocks 210_1, 210_2, 210_3, . . . such that the second scan clock signal SCLK2 is not transmitted to the output terminal OUT. The first capacitor C11 stores the gate voltage of the second transistor M12.

The seventh transistor M17 includes a gate electrode connected to the second clock signal input terminal CLK2, a first terminal connected to the power source VGH, and a second terminal connected to the gate electrode of the eighth transistor M18.

The eighth transistor M18 includes a gate electrode connected to the second terminal of the seventh transistor M17 and a first terminal of the ninth transistor M19, a second connected to the entire clock signal input terminal GCK, and a first terminal connected to the first node N11.

The ninth transistor M19 includes a gate electrode connected to the simultaneous light emission control signal input terminal CS, a second terminal connected to the power source VGL, and a first terminal connected to the gate electrode of the eighth transistor M18.

The second capacitor C12 includes a first terminal connected to the first node N11 and a second terminal connected to the gate electrode of the eighth transistor M18.

The first node N11 is connected to the second terminal of the first transistor M11, the first terminal of the second transistor M12, the gate electrode of the fifth transistor M15, the first terminal of the first capacitor C11, the first terminal of the eighth transistor M12, the first terminal of the second capacitor C12, and the output terminal OUT.

The seventh transistor M17 turns off the eighth transistor M18 when the signal of the logic low level input to the second clock signal input terminal CLK2 is output to the output terminal OUT such that the entire clock signal SGCK is not transmitted to the output terminal OUT. The seventh transistor M17 is turned on by the signal input to the second clock signal input terminal CLK2 to transmit the power source voltage VGH to the gate electrode of the eighth transistor such that the eighth transistor M18 is turned off. The ninth transistor M19 is turned on by the simultaneous light emission control signal CSP to transmit the power source voltage VGL to the gate electrode of the eighth transistor M18 such that the eighth transistor M18 is turned on. The eighth transistor M18 transmits the entire clock signal SGCK to the output terminal OUT. The second capacitor C12 stores the gate-on voltage of the eighth transistor M18 during simultaneous driving and the gate-off voltage of the eighth transistor M18 during sequential driving.

A plurality of transistors M11, M12, M13, M14, M15, M16, M17, M18, and M19 are p-channel field effect transistors. The gate on voltage turning on the plurality of transistors M11, M12, M13, M14, M15, M16, M17, M18, and M19 is the voltage of the logic low level, and the gate-off voltage turning them off is the voltage of the logic high level. At least one of a plurality of transistors M11, M12, M13, M14, M15, M16, M17, M18, and M19 may be an n-channel field effect transistor, the gate-on voltage turning on the n-channel field effect transistor is the voltage of the logic high level, and the gate-off voltage turning off it is the voltage of the logic low level.

Figure 6:
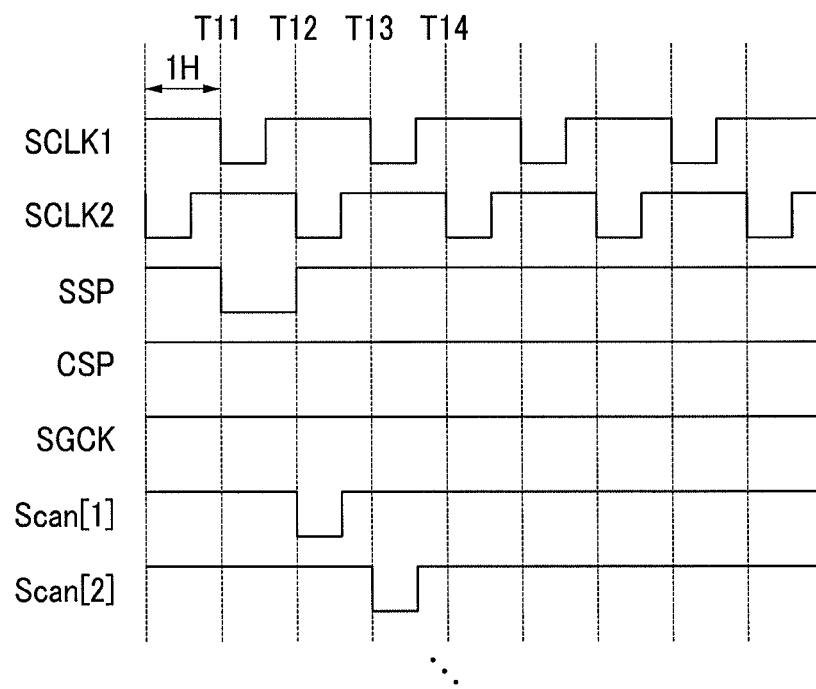
FIG. 6 is a timing diagram to explain a sequential driving method of the scan driver of FIG. 4.

FIG. 6 is a timing diagram to explain a sequential driving method of the scan driver of FIG. 4. Referring to FIG. 6, the sequential driving method of the scan driver may be applied to the scan step for transmitting the data signal to a plurality of pixels.

Under the sequential driving of the scan driver, the first clock signal SCLK1 and the second clock signal SCLK2 apply the voltage of the logic low level with an interval of 2 horizontal cycles, and the duty is about 1 horizontal cycle. The 1 horizontal cycle is referred to as 1H and is the same as one cycle of the horizontal synchronization signal Hsync and the data enable signal DE. A period, in which the voltage for turning on the transistor included in the scan driving block is applied, among one cycle of the clock signal, is referred to as a duty of the clock signal. The second clock signal SCLK2 is a signal in which the first clock signal SCLK1 is shifted by 1 horizontal cycle. The first clock signal SCLK1 and the second clock signal SCLK2 are alternatively applied as the voltage of the logic low level with the interval of 1 horizontal cycle.

Under the sequential driving of the scan driver, the simultaneous light emission control signal CSP and the entire clock signal SGCK are applied as the voltage of the logic high level. The sixth transistor M16 and the ninth transistor M19 are turned off by the simultaneous light emission control signal CS of the logic high level, and the eighth transistor M18 maintains the turn-off state such that the entire clock signal SGCK is not transmitted to the first node N11.

As an example, the first scan driving block 210_1 is described.

At the time T11, the first clock signal SCLK1 and the scan start signal SSP are applied as the logic low level voltage. The second clock signal SCLK2 is applied as the voltage of the logic high level. The third transistor M13 and the fourth transistor M14 are turned on by the first clock signal SCLK1, the second transistor M12 is turned on by the scan start signal SSP, while the power source voltage VGL is transmitted to the gate electrode of the first transistor M11 through the fourth transistor M14. Thus, the first transistor M11 is turned on. The power source voltage VGH is transmitted to the first node N11 through the turned on first transistor M11. The logic high level voltage of the first node N11 is output to the output terminal OUT as the scan signal Scan[1]. The logic high level voltage is applied to one terminal of the first capacitor C11, and the logic low level voltage is applied to the other terminal such that the first capacitor C11 is charged. The first capacitor C11 stores the gate-on voltage of the second transistor M12.

At a time T12, the second clock signal SCLK2 is applied as the logic low level voltage. The first clock signal SCLK1 and the scan start signal SSP are applied as the logic high level voltage. The third transistor M13 and the fourth transistor M14 are turned off by the first clock signal SCLK1. The second transistor M12 maintains the turned-on state by the voltage charged to the first capacitor C11, and the second clock signal SCLK2 of the logic low level is transmitted to the first node N11 through the turned on second transistor M12. The voltage of the logic low level of the first node N11 turns on the fifth transistor M15. The power source voltage VGH is transmitted to the gate electrode of the first transistor M11 through the turned on fifth transistor M15 such that the first transistor M11 is turned-off. Accordingly, the voltage of the logic low level of the first node N11 is output to the output terminal OUT as the scan signal Scan[1]. The seventh transistor M17 is turned on by the second clock signal SCLK2, and the power source voltage VGH is transmitted to the other terminal of the second capacitor C12 by the turned on seventh transistor M17. One terminal of the second capacitor C12 is applied with the logic low level voltage, and the other terminal is applied with the logic high level voltage, thereby being charged. The second capacitor C12 stores the gate-off voltage of the eighth transistor M18. Thus, the scan signal of the logic low level output to the output terminal OUT is stably output.

If the second clock signal SCLK2 is converted into the logic high level voltage, the scan signal of the logic high level is output at the output terminal OUT. The scan signal is output as the logic low level voltage by the duty of the first clock signal SCLK1 or the second clock signal SCLK2.

At a time T13, the first clock signal SCLK1 is applied as the logic low level voltage. The second clock signal SCLK2 and the scan start signal SSP are applied as the logic high level voltage. The third transistor M13 and the fourth transistor M14 are turned on by the first clock signal SCLK1. The power source voltage VGL is transmitted to the gate electrode of the first transistor M11 through the turned on fourth transistor M14. Thus, the first transistor M11 is turned on. The second transistor M12 is turned off by the scan start signal SSP. The power source voltage VGH is transmitted to the first node N11 through the turned on first transistor M11. One terminal and the second terminal of the first capacitor C11 are applied with the logic high level voltage to be discharged. The logic high level voltage of the first node N11 is output as the scan signal Scan[1]. While the first clock signal SCLK1 is cyclically applied as the logic low level voltage, the first capacitor C11 is discharged and the scan signal Scan[1] of the logic high level is output.

The scan signal Scan[1] of the logic low level of the first scan driving block is transmitted to the scan start signal input terminal SP of the second scan driving block, and the second scan driving block outputs the scan signal Scan[2] of the logic low level at the time T13.

In this method, the scan signal of the logic low level is sequentially output from the first scan driving block to the n-th scan driving block.

Figure 7:
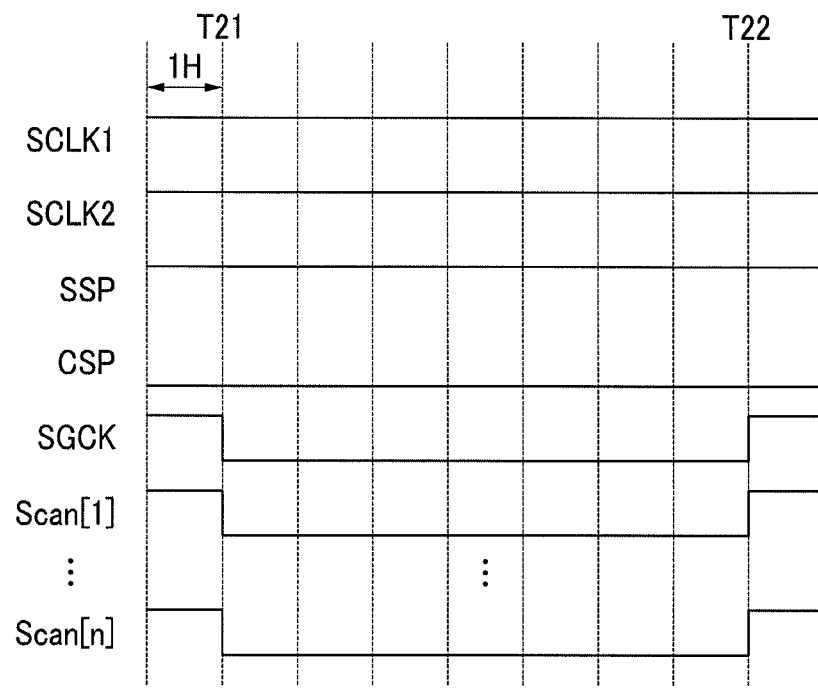
FIG. 7 is a timing diagram to explain a simultaneous driving method of the scan driver of FIG. 4.

FIG. 7 is a timing diagram to explain a simultaneous driving method of the scan driver of FIG. 4. Referring to FIG. 7, the simultaneous driving method of the scan driver may be applied to the reset step for resetting the driving voltage of the organic light emitting diode (OLED) of a plurality of pixels and during the threshold voltage compensation step for compensating the threshold voltage of the driving transistor of a plurality of pixels.

Under the simultaneous driving of the scan driver, the first clock signal SCLK1, the second clock signal SCLK2, and the scan start signal SSP are applied as the logic high level voltage and the simultaneous light emission control signal CSP is applied as the logic low level voltage. The scan signal of the logic low level is output to all the scan driving blocks, according to the application of the logic low level voltage of the entire clock signal SGCK. The scan signal of the logic high level is output to all the scan driving blocks, according to the logic high level voltage of the entire clock signal SGCK. If the simultaneous light emission control signal CSP is applied as the gate-on voltage, the scan driver simultaneously outputs the entire clock signal SGCK.

The third transistor M13 and the fourth transistor M14 are turned off by the first clock signal SCLK1 of the logic high level, and the seventh transistor M17 is turned off by the second clock signal SCLK2 of the logic high level. The sixth transistor M16 and the ninth transistor M19 are turned on by the simultaneous light emission control signal CSP. The power source voltage VGH is transmitted to the gate electrode of the second transistor M12 through the turned on sixth transistor M16, such that the second transistor M12 is turned off. The power source voltage VGL is transmitted to the gate electrode of the eighth transistor M18 through the turned on ninth transistor M19, such the eighth transistor M18 is turned on. The power source voltage VGL transmitted through the turned on ninth transistor M19 is transmitted to the other terminal of the second capacitor C12. The second capacitor C12 stores the gate-on voltage of the eighth transistor M18.

At the time T21, if the entire clock signal SGCK is applied as the logic low level voltage, the first node N11 is transmitted with the logic low level voltage. The logic low level voltage of the first node N11 turns on the fifth transistor M15, and the power source voltage VGH is transmitted to the gate electrode of the first transistor M11 through the turned on fifth transistor M15. Thus, the first transistor M11 is turned off. The logic low level voltage of the first node N11 is output as the scan signal. The entire clock signal SGCK is simultaneously transmitted to all scan driving blocks such that all scan driving blocks simultaneously output the scan signals Scan[1]-Scan[n] of the logic low level.

At the time T22, if the entire clock signal SGCK is applied as the logic high level voltage, the first node N11 is applied with the logic high level voltage, and the logic high level voltage of the first node N11 is output as the scan signal.

When the simultaneous light emission control signal CSP is applied as the gate-on voltage, all scan driving blocks 210_1, 210_2, 210_3, ... simultaneously output the scan signals Scan[1]-Scan[n] of the gate-on voltage during the period in which the entire clock signal SGCK is applied as the gate-on voltage. All scan driving blocks 210_1, 210_2, 210_3, ... simultaneously output the scan signals Scan[1]-Scan[n] of the gate-off voltage during the period in which the entire clock signal SGCK is applied as the gate-off voltage.

Figure 8:
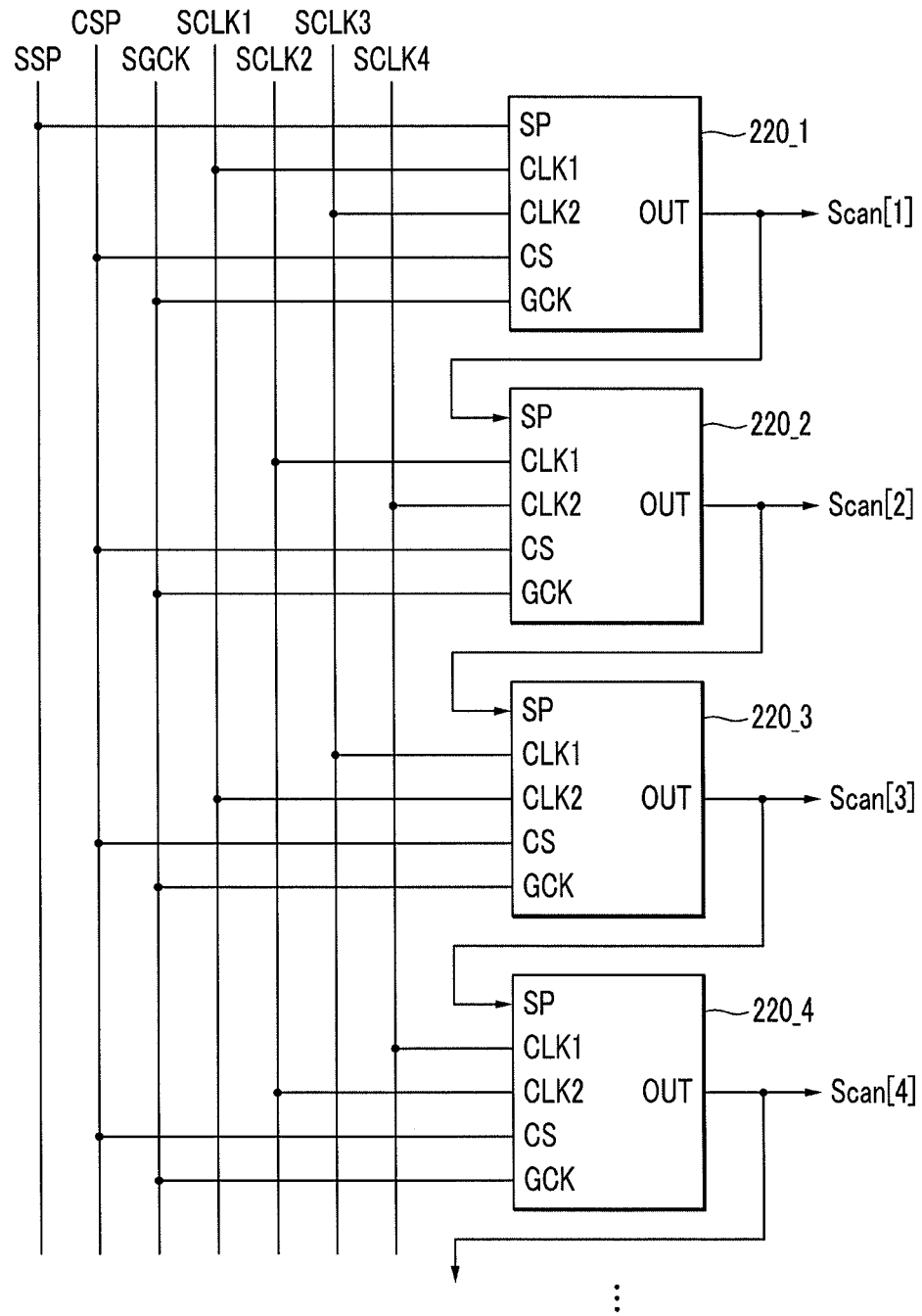
FIG. 8 is a block diagram of a configuration of a scan driver according to another exemplary embodiment.

FIG. 8 is a block diagram of a configuration of a scan driver according to another exemplary embodiment Referring to FIG. 8, a period in which the scan signal of the logic low level is sequentially output from the first scan driving block to the n-th scan driving block is 1 horizontal cycle. The period is not overlapped in FIG. 4. As the size of the display device is increased and the driving method is further complicated, it is necessary for the scan signal of the gate on voltage that is sequentially output to be overlapped and output.

The third clock signal SCLK3 and the fourth clock signal SCLK4 are additionally applied to the scan driver of FIG. 4, and the scan signal of the gate-on voltage that is sequentially output may partially overlap. The difference of the configuration of the scan driver will be described in comparison with FIG. 4.

The input signal of each of the scan driving blocks 220_1, 220_2, 220_3, 220_4, ... includes the scan start signal SSP, the simultaneous light emission control signal CSP, the entire clock signal SGCK, the first clock signal SCLK1, the second clock signal SCLK2, the third clock signal SCLK3, and the fourth clock signal SCLK4. Each input signal is applied to a different wire.

In the adjacent four scan driving blocks, the first clock signal SCLK1, the second clock signal SCLK2, the third clock signal SCLK3, and the fourth clock signal SCLK4 are applied to different clock signal input terminals. For example, the first clock signal input terminal CLK1 is connected to the wire of the first clock signal SCLK1, and the second clock signal input terminal CLK2 is connected to the wire of the third clock signal SCLK3 in the first scan driving block 220_1. In the second scan driving block 220_2, the first clock signal input terminal CLK1 is connected to the wire of the second clock signal SCLK2, and the second clock signal input terminal CLK2 is connected to the wire of the fourth clock signal SCLK4. In third scan driving block 220_3, the first clock signal input terminal CLK1 is connected to the wire of the third clock signal SCLK3, and the second clock signal input terminal CLK2 is connected to the wire of the first clock signal SCLK1. In the fourth scan driving block 220_4, the first clock signal input terminal CLK1 is connected to the wire of the fourth clock signal SCLK4, and the second clock signal input terminal CLK2 is connected to the wire of the second clock signal SCLK2. That is, four clock signals SCLK1, SCLK2, SCLK3, and SCLK4 are input to the clock signal input terminals CLK1 and CLK2 of a plurality of scan driving blocks 220_1, 220_2, 220_3, 220_4, ... as four types.

Figure 9:
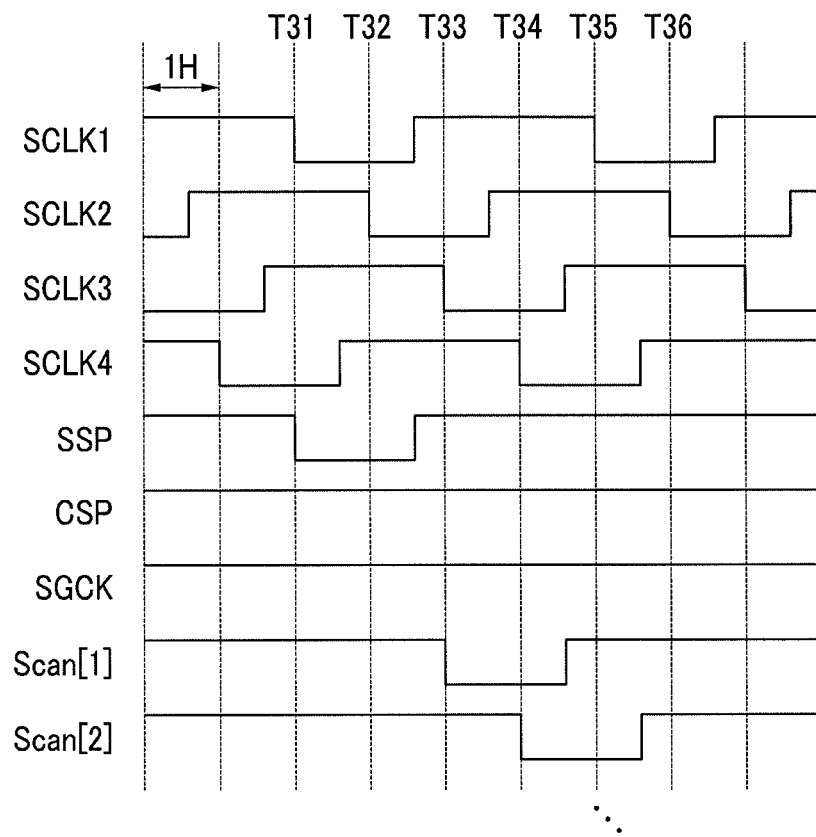
FIG. 9 is a timing diagram to explain a sequential driving method of the scan driver of FIG. 8.

FIG. 9 is a timing diagram to explain a sequential driving method of the scan driver of FIG. 8.

Referring to FIG. 9, it is assumed that the scan driving block is configured similar to FIG. 5, and the differences will be described in comparison with FIG. 6.

Under the sequential driving, the first clock signal SCLK1, the second clock signal SCLK2, the third clock signal SCLK3, and the fourth clock signal SCLK4 apply the logic low level voltage with the interval of 4 horizontal cycles, and the duty is about 2 horizontal cycles. The second clock signal SCLK2 is the signal in which the first clock signal SCLK1 is shifted by 1 horizontal cycle. The third clock signal SCLK3 is the signal in which the second clock signal SCLK2 is shifted by 1 horizontal cycle. The fourth clock signal SCLK4 is the signal in which the third clock signal SCLK3 is shifted by 1 horizontal cycle.

In each of the scan driving blocks 220_1, 220_2, 220_3, 220_4, . . . , the signal of the gate-on voltage input to the second clock signal input terminal CLK2 is the signal in which the signal of the gate-on voltage input to the first clock signal input terminal CLK1 is shifted by 2 horizontal cycles.

As an example, the first scan driving block 220_1 is described.

At the time T31, the first clock signal SCLK1 and the scan start signal SSP are applied as the logic low level voltage. The third clock signal SCLK3 is applied as the logic high level voltage. The first transistor M11, the second transistor M12, the third transistor M13, and the fourth transistor M14 are turned on. The power source voltage VGH is transmitted to the first node N11 through the turned on first transistor M11. The logic high level voltage of the first node N11 is output to the output terminal OUT as the scan signal Scan[1]. One terminal of the first capacitor C11 is applied with the logic high level voltage and the other terminal is applied with the logic low level voltage to be charged.

At the time T33, the third clock signal SCLK3 is applied as the logic low level voltage. The first clock signal SCLK1 and scan start signal SSP are applied as the logic high level voltage. The second transistor M12 maintains the turned-on state by the voltage charged to the first capacitor C11. The third clock signal SCLK3 of the logic low level is output to the output terminal OUT as the scan signal Scan[1], through the turned on second transistor M12. The scan signal Scan[1] of the logic low level is output as the logic low level voltage by the duty of the third clock signal SCLK3.

As the time T35, the first clock signal SCLK1 is applied as the logic low level voltage. The third clock signal SCLK3 and the scan start signal SSP are applied as the logic high level voltage. The first transistor M11, the third transistor M13, and the fourth transistor M14 are turned on. The power source voltage VGH is transmitted to the first node N11 through the turned on first transistor M11. One terminal and the second terminal of the first capacitor C11 are applied with the logic high level voltage to be discharged. The logic high level voltage of the first node N11 is output as the scan signal Scan[1].

At the time T33, the scan signal Scan[1] of the logic low level of the first scan driving block is applied to the scan start signal input terminal SP of the second scan driving block. The first clock signal input terminal CLK1 of the second scan driving block is applied with the second clock signal SCLK2 of the logic low level. The second clock signal input terminal CLK2 is applied with the fourth clock signal SCLK4 of the logic high level. The gate-on voltage of the second transistor M12 is stored to the first capacitor C11 of the second scan driving block. At the time T34, the second scan driving block outputs the fourth clock signal SCLK4 of the logic low level as the scan signal Scan[2]. The scan signal Scan[2] of the logic low level of the second scan driving block is output as the logic low level voltage by the duty of the fourth clock signal SCLK4.

In this method, the scan signal of the logic low level is sequentially output from the first scan driving block to the n-th scan driving block. The scan signal of each scan driving block is output as the logic low level voltage by the duty of the clock signal, input to the second clock signal input terminal CLK2.

The scan driver 200 may execute the sequential driving by shifting and inputting the signal of the gate-on voltage input to the second clock signal input terminal CLK2 of each scan driving block and the signal of the gate-on voltage input to the first clock signal input terminal CLK1 by the duty of the signal input to the first clock signal input terminal CLK1. The scan signal of each scan driving block is output as the gate-on voltage by the duty of the signal input to the second clock signal input terminal CLK2.

Under the simultaneous driving of the scan driver, the first clock signal SCLK1, the second clock signal SCLK2, the third clock signal SCLK3, the fourth clock signal SCLK4, and the scan start signal SSP are applied as the logic high level voltage, and the simultaneous light emission control signal CSP is applied as the logic low level voltage. As described in FIG. 7, the entire clock signal SGCK is applied as the logic low level voltage, such that the scan signal of the logic low level is output in all scan driving blocks. The entire clock signal SGCK is applied as the logic high level voltage, such that the scan signal of the logic high level is output in all scan driving blocks.

A circuit diagram of a scan driving block, included in the scan driver of FIG. 4 or FIG. 8, according to another exemplary embodiment will be described. The description will focus on the difference from the circuit diagram of the scan driving block described in FIG. 5.

Figure 10:
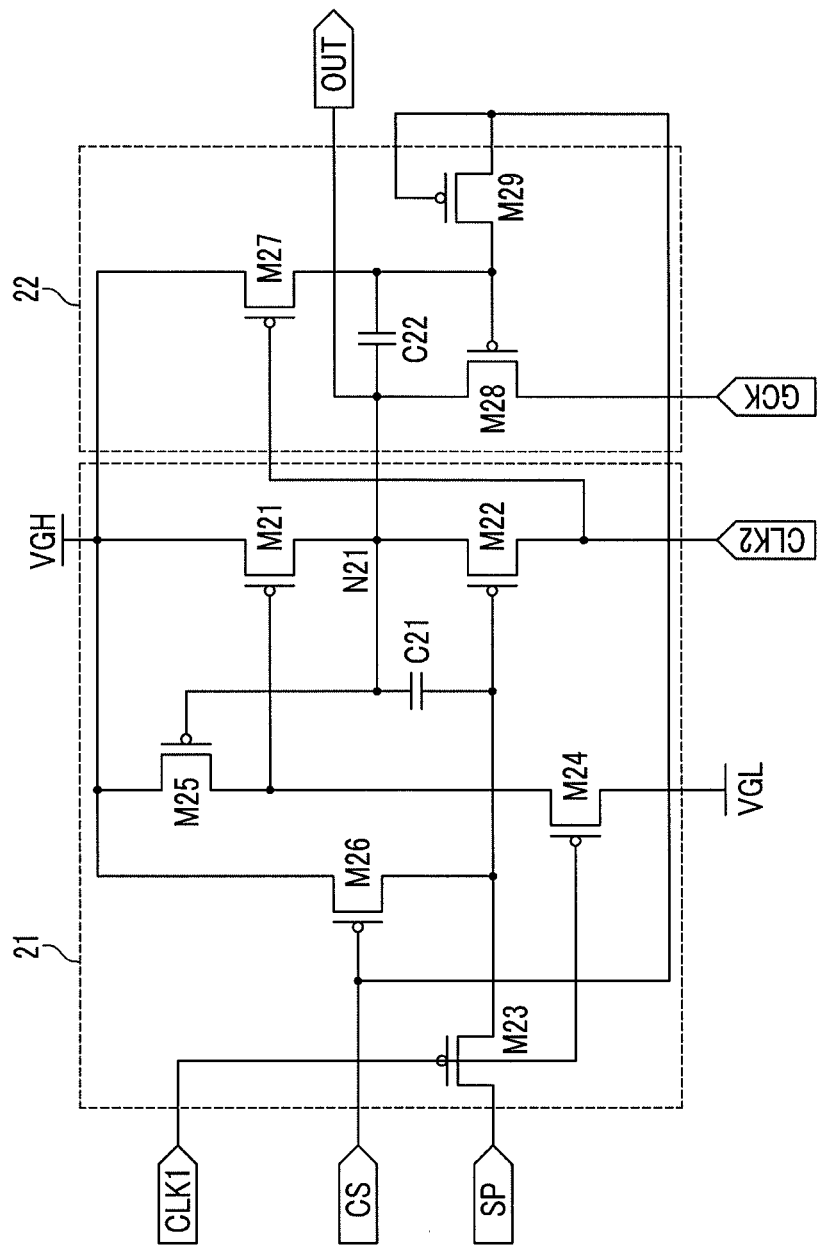
FIG. 10 is a circuit diagram of a scan driving block included in the scan driver of FIG. 4 or FIG. 8 according to another exemplary embodiment.

FIG. 10 is a circuit diagram of a scan driving block included in the scan driver of FIG. 4 or FIG. 8 according to another exemplary embodiment.

Referring to FIG. 10, the scan driving block includes a sequential driver 21 to sequentially output the scan signal and a simultaneous driver 22 to simultaneously output the scan signal.

The sequential driver 21 includes a plurality of transistors M21, M22, M23, M24, M25, and M26 and the first capacitor C21. The simultaneous driver 22 includes a plurality of transistor M27, M28, and M29 and the second capacitor C22.

In comparison to FIG. 5, the ninth transistor M29 is diode-connected to the simultaneous light emission control signal input terminal CS. The ninth transistor M29 includes the gate electrode connected to the simultaneous light emission control signal input terminal CS, one terminal connected to the simultaneous light emission control signal input terminal CS, and the other terminal connected to the gate electrode of the eighth transistor M28. The ninth transistor M29 is connected to the simultaneous light emission control signal input terminal CS with the diode state in which one terminal and gate electrode are connected.

The ninth transistor M29 is turned on by the simultaneous light emission control signal CSP of the logic low level under the simultaneous driving to transmit the simultaneous light emission control signal CSP of the logic low level to the gate electrode of the eighth transistor M28 such that the entire clock signal SGCK is output to the output terminal OUT through the eighth transistor M28.

Figure 11:
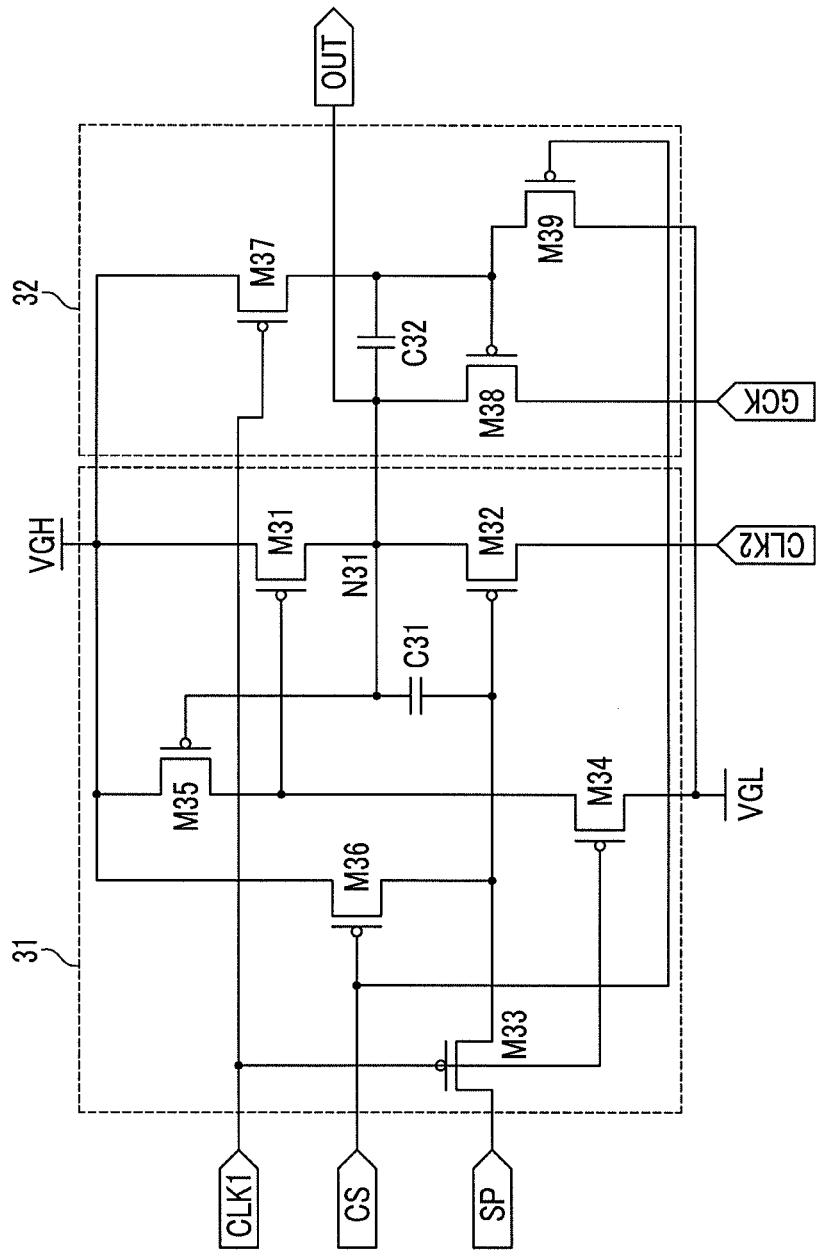
FIG. 11 is a circuit diagram of a scan driving block included in the scan driver of FIG. 4 or FIG. 8 according to another exemplary embodiment.

FIG. 11 is a circuit diagram of a scan driving block included in the scan driver of FIG. 4 or FIG. 8 according to another exemplary embodiment.

Referring to FIG. 11, the scan driving block includes a sequential driver 31 to sequentially output the scan signal and a simultaneous driver 32 to simultaneously output the scan signal.

The sequential driver 31 includes a plurality of transistors M31, M32, M33, M34, M35, and M36 and the first capacitor C31. The simultaneous driver 32 includes a plurality of transistors M37, M38, and M39 and the second capacitor C32.

In comparison with FIG. 5, the seventh transistor M37 is not connected to the second clock signal input terminal CLK2. The seventh transistor M37 is connected to the first clock signal input terminal CLK1. The seventh transistor M37 includes the gate electrode connected to the first clock signal input terminal CLK1, one terminal connected to the power source VGH, and the other terminal connected to the gate electrode of the eighth transistor M38. The seventh transistor M37 is turned on/off by the signal (e.g., the first clock signal SCLK1 or the second clock signal SCLK2) input to the first clock signal input terminal CLK1.

The seventh transistor M37 is turned off under the simultaneous driving, and transmits the power source voltage VGH to the gate electrode of the eighth transistor M38 under the sequential driving.

Figure 12:
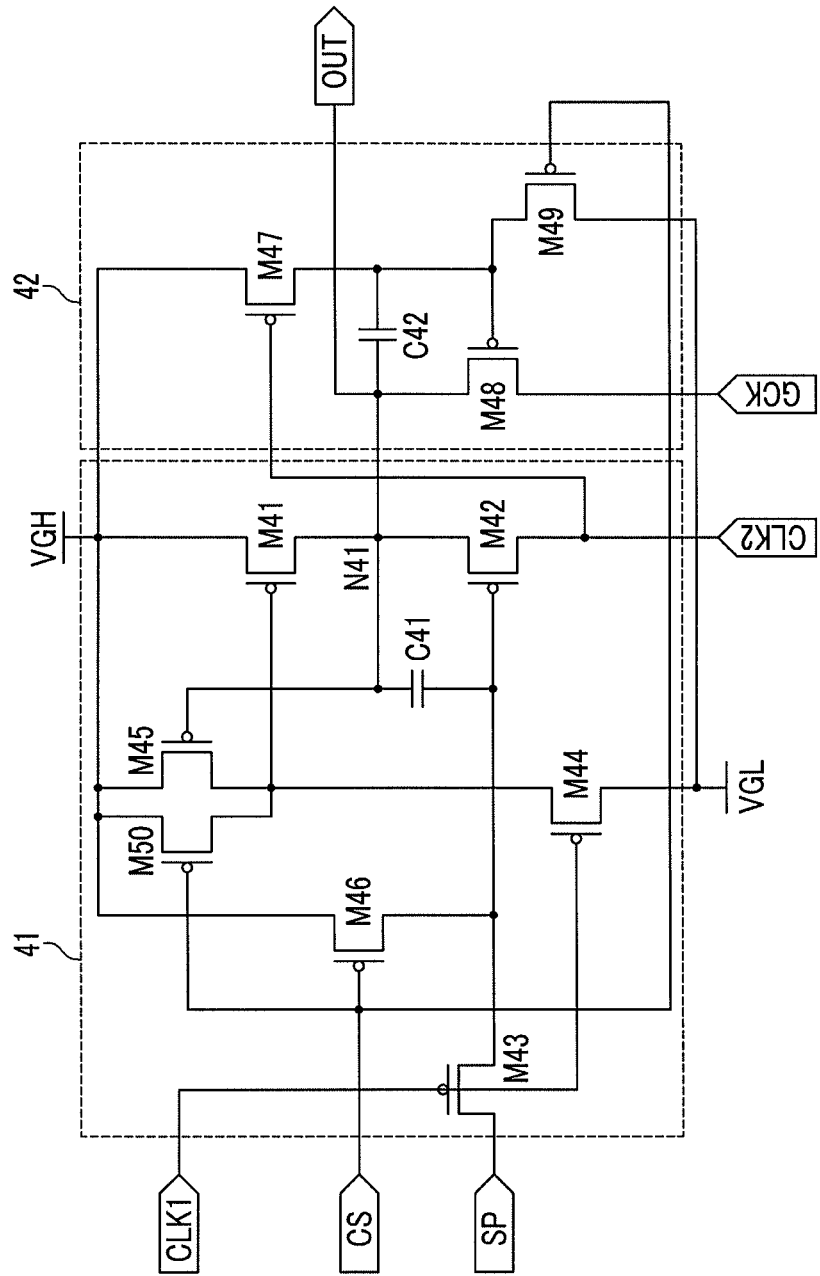
FIG. 12 is a circuit diagram of a scan driving block included in the scan driver of FIG. 4 or FIG. 8 according to another exemplary embodiment.

FIG. 12 is a circuit diagram of a scan driving block included in the scan driver of FIG. 4 or FIG. 8 according to another exemplary embodiment.

Referring to FIG. 12, the scan driving block includes a sequential driver 41 to sequentially output the scan signal and a simultaneous driver 42 to simultaneously output the scan signal.

The sequential driver 41 includes a plurality of transistors M41, M42, M43, M44, M45, M46, and M50 and the first capacitor C41. The simultaneous driver 42 includes a plurality of transistors M47, M48, and M49 and the second capacitor C42.

In comparison with FIG. 5, the sequential driver 41 further includes the tenth transistor M50. The tenth transistor M50 includes the gate electrode connected to the simultaneous light emission control signal input terminal CS, one terminal connected to the power source VGH, and the other terminal connected to the gate electrode of the first transistor M41. The tenth transistor M50 is turned on/off by the simultaneous light emission control signal CSP.

The tenth transistor M50 is turned on by the simultaneous light emission control signal CSP under the simultaneous driving in which the simultaneous light emission control signal CSP is applied as the logic low level voltage to transmit the power source voltage VGH to the gate electrode of the first transistor M41, such that the first transistor is turned off. The first node N41 is applied with the entire clock signal SGCK of the logic low level under the simultaneous driving. At this time, the tenth transistor M50 blocks the first transistor M41, such that a leakage current by the power source voltage VGH does not flow.

Figure 13:
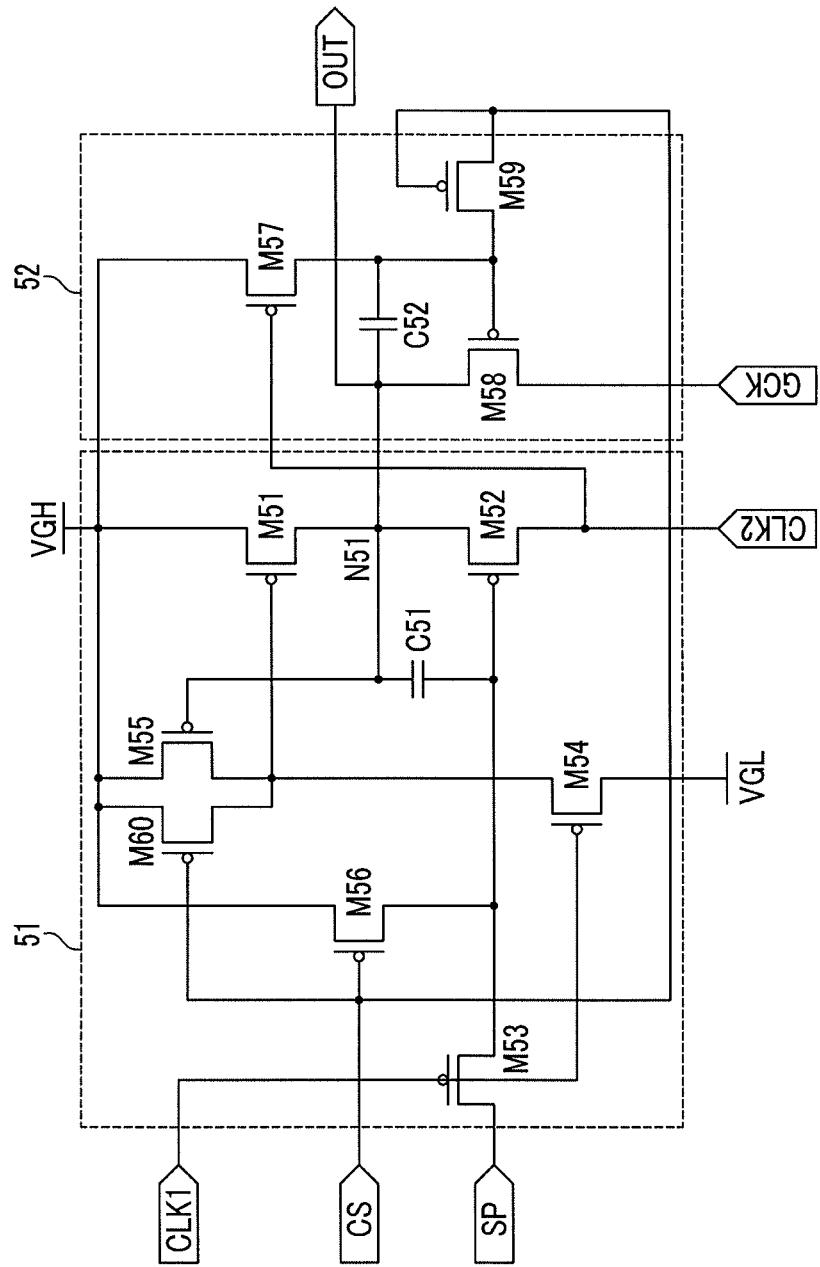
FIG. 13 is a circuit diagram of a scan driving block included in the scan driver of FIG. 4 or FIG. 8 according to another exemplary embodiment.

FIG. 13 is a circuit diagram of a scan driving block included in the scan driver of FIG. 4 or FIG. 8 according to another exemplary embodiment.

Referring to FIG. 13, the scan driving block includes a sequential driver 51 to sequentially output the scan signal and a simultaneous driver 52 to simultaneously output the scan signal.

The sequential driver 51 includes a plurality of transistors M51, M52, M53, M54, M55, M56, and M60 and the first capacitor C51. The simultaneous driver 52 includes a plurality of transistors M57, M58, and M59 and the second capacitor C52.

In comparison with FIG. 5, the ninth transistor M59 is diode-connected to the simultaneous light emission control signal input terminal CS, and the sequential driver 51 further includes the tenth transistor M60.

The ninth transistor M59 includes a gate electrode connected to the simultaneous light emission control signal input terminal CS, a second terminal connected to the simultaneous light emission control signal input terminal CS, and a first terminal connected to a gate electrode of the eighth transistor M58. The ninth transistor M59 is diode-connected to the simultaneous light emission control signal input terminal CS. The ninth transistor M59 is turned on by the simultaneous light emission control signal CSP of the logic low level under the simultaneous driving such that the simultaneous light emission control signal CSP of the logic low level is transmitted to the gate electrode of the eighth transistor M58 and the entire clock signal SGCK is output to the output terminal OUT through the eighth transistor M28.

The tenth transistor M60 includes a gate electrode connected to the simultaneous light emission control signal input terminal CS, a first terminal connected to the power source VGH, and a second terminal connected to the gate electrode of the first transistor M51. The tenth transistor M60 is turned on under the simultaneous driving in which the simultaneous light emission control signal CSP is applied as the logic low level voltage such that the power source voltage VGH is transmitted to the gate electrode of the first transistor M51. The tenth transistor M60 blocks the first transistor M51 such that the leakage current by the power source voltage VGH does not flow to the first node N51 through the first transistor M51.

Figure 14:
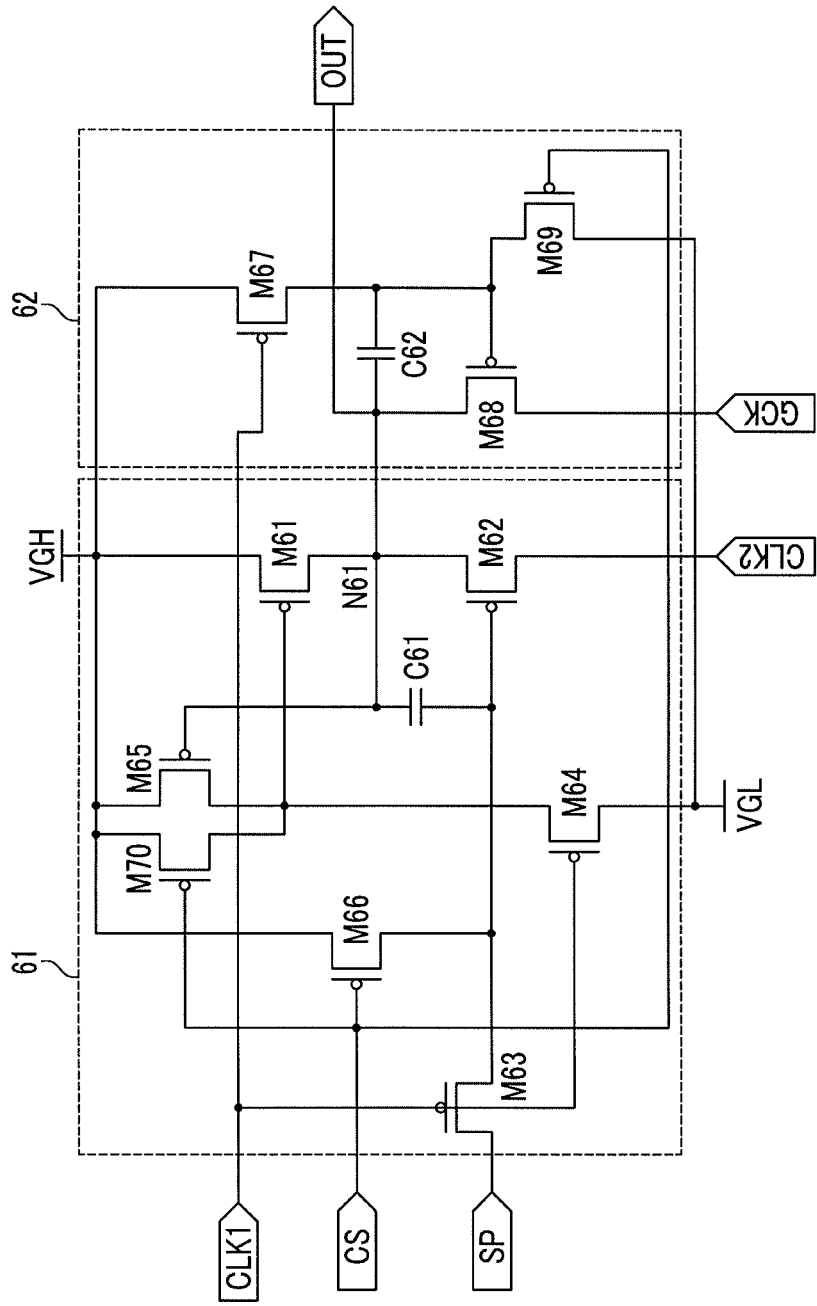
FIG. 14 is a circuit diagram of a scan driving block included in the scan driver of FIG. 4 or FIG. 8 according to another exemplary embodiment.

FIG. 14 is a circuit diagram of a scan driving block included in the scan driver of FIG. 4 or FIG. 8 according to another exemplary embodiment. Referring to FIG. 14, the scan driving block includes a sequential driver 61 to sequentially output the scan signal and a simultaneous driver 62 to simultaneously output the scan signal.

The sequential driver 61 includes a plurality of transistors M61, M62, M63, M64, M65, M66, and M70 and the first capacitor C61. The simultaneous driver 62 includes a plurality of transistors M67, M68, and M69 and the second capacitor C62.

In comparison with FIG. 5, the seventh transistor M67 is connected to the first clock signal input terminal CLK1, and the sequential driver 61 further includes the tenth transistor M70.

The seventh transistor M67 includes a gate electrode connected to the first clock signal input terminal CLK, a first terminal connected to the power source VGH, and a second terminal connected to the gate electrode of the eighth transistor M68. The seventh transistor M67 is turned on/off by the signal (e.g., the first clock signal SCLK1 or the second clock signal SCLK2) input to the first clock signal input terminal CLK1. The seventh transistor M67 is turned off under the simultaneous driving, and transmits the power source voltage VGH to a gate electrode of the eighth transistor M68 during sequential driving.

The tenth transistor M70 includes a gate electrode connected to the simultaneous light emission control signal input terminal CS, a first terminal connected to the power source VGH, and a second terminal connected to the gate electrode of the first transistor M61. The tenth transistor M70 is turned on during simultaneous driving in which the simultaneous light emission control signal CSP is applied as the logic low level voltage such that the power source voltage VGH is transmitted to the gate electrode of the first transistor M61. The tenth transistor M70 blocks the first transistor M61 such that the leakage current by the power source voltage VGH does not flow to the first node N61 through the first transistor M61.

By way of summation and review, a scan driver, according to present embodiments, may simultaneously apply the scan signal while executing a function of a shift register sequentially applying the scan signal. The sequential driving and the simultaneous driving may be realized by using a small number of clock signals, such that the scan driver may be simplified and the size may be reduced. Thus, size and cost of the scan driver for the display device is reduced.

Exemplary embodiments of the inventive concept have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the inventive concept as set forth in the following claims.

What is claimed is:

1. A scan driver, comprising:
a first scan driving block, the first scan driving block receiving a first clock signal, a second clock signal, an entire clock signal, and a simultaneous light emitting control signal, the first scan driving block outputting the second clock signal to a first output terminal according to an input signal, in synchronization with the first clock signal; and
a second scan driving block, the second scan driving block receiving the first clock signal, the second clock signal, the entire clock signal, and the simultaneous light emitting control signal, the second scan driving block receiving the output signal of the first scan driving block and outputting the first clock signal according to the output signal of the first scan driving block to a second output terminal, in synchronization with the second clock signal, wherein:
the first scan driving block and the second scan driving block simultaneously output the entire clock signal according to a level of the simultaneous light emission control signal, and
a first input terminal of the first scan driving block is input with the first clock signal, a second input terminal of the first scan driving block is input with the second clock signal, a first input terminal of the second scan driving block is input with the second clock signal, and a second input terminal of the second scan driving block is input with the first clock signal.

2. The scan driver as claimed in claim 1, wherein:
when the simultaneous light emission control signal is applied as a gate-on voltage, the first scan driving block and the second scan driving block simultaneously output the entire clock signal.

3. The scan driver as claimed in claim 2, wherein:
when the simultaneous light emission control signal is applied as the gate-on voltage, the first clock signal and the second clock signal are applied as a gate-off voltage.

4. The scan driver as claimed in claim 2, wherein:
when the simultaneous light emission control signal is applied as a gate-off voltage, the first scan driving block outputs the second clock signal to the first output terminal and the second scan driving block outputs the first clock signal to the second output terminal.

5. The scan driver as claimed in claim 4, wherein:
the first scan driving block outputs a scan signal of a gate-on voltage to the first output terminal by a duty of the second clock signal, and the second scan driving block outputs the scan signal of the gate-on voltage to the second output terminal by the duty of the first clock signal.

6. The scan driver as claimed in claim 5, wherein:
the second clock signal is a signal which is shifted by the duty of the first clock signal.

7. The scan driver as claimed in claim 5, wherein:
the second clock signal is a signal in which the first clock signal is shifted by 1 horizontal cycle.

8. The scan driver as claimed in claim 5, wherein:
the second clock signal is a signal in which the first clock signal is shifted by 2 horizontal cycles.

9. The scan driver as claimed in claim 1, wherein:
the input signal of the first scan driving block is a scan start signal or an output signal of a previous scan driving block.

10. A scan driver, comprising:
a plurality of scan driving blocks, each scan driving block of the plurality of scan driving blocks receiving a first clock signal, a second clock signal, an entire clock signal, and a simultaneous light emitting control signal, each scan driving block of the plurality of scan driving blocks including:
a sequential driver sequentially outputting a scan signal through a first output terminal; and
a simultaneous driver simultaneously outputting the entire clock signal through a second output terminal according to a level of the simultaneous light emission control signal,
wherein the sequential driver includes:
a first transistor transmitting a first power source voltage to the first output terminal;
a second transistor turned on by an input signal transmitted by the first clock signal input to a first clock signal input terminal, to transmit the second clock signal input to a second clock signal input terminal to the first output terminal;
a third transistor turned on by the first clock signal, to transmit the input signal to a gate electrode of the second transistor; and
a fourth transistor turned on by the first clock signal, to transmit a second power source voltage to a gate electrode of the first transistor,
wherein the input signal is a scan start signal or an output signal of a previous scan driving block.

11. The scan driver as claimed in claim 10, the sequential driver further including:
a first capacitor storing the gate voltage of the second transistor.

12. The scan driver as claimed in claim 10, the sequential driver further including:
a fifth transistor, turning off the first transistor when the second clock signal is output to the first output terminal as a logic low level voltage, such that the first power source voltage is not transmitted to the first output terminal.

13. The scan driver as claimed in claim 10, the sequential driver further including:
a sixth transistor, turning off the second transistor, when the entire clock signal is output to the first output terminal, such that the second clock signal is not transmitted to the first output terminal.

14. The scan driver as claimed in claim 10, the simultaneous driver further including:
a seventh transistor, for preventing transmission of the entire clock signal to the second output terminal, when the second clock signal is transmitted to the second output terminal;
an eighth transistor transmitting the entire clock signal to the second output terminal; and
a ninth transistor, turned on by the simultaneous light emission control signal to turn on the eighth transistor.

15. The scan driver as claimed in claim 14, the simultaneous driver further including:
a second capacitor, storing a gate-on voltage and a gate-off voltage of the eighth transistor.

16. The scan driver as claimed in claim 14, wherein:
the seventh transistor is turned on by the second clock signal, to transmit the first power source voltage to a gate electrode of the eighth transistor, such that the eighth transistor is turned off.

17. The scan driver as claimed in claim 14, wherein:
the seventh transistor is turned on by the first clock signal, to transmit the first power source voltage to a gate electrode of the eighth transistor, such that the eighth transistor is turned off.

18. The scan driver as claimed in claim 14, wherein:
the ninth transistor is turned on by the simultaneous light emission control signal, to transmit the second power source voltage to a gate electrode of the eighth transistor, such that the eighth transistor is turned on.

19. The scan driver as claimed in claim 14, wherein:
the ninth transistor is turned on by the simultaneous light emission control signal, to transmit the simultaneous light emission control signal to a gate electrode of the eighth transistor, such that the eighth transistor is turned on.

20. The scan driver as claimed in claim 10, the sequential driver further including:
a tenth transistor, turned on by the simultaneous light emission control signal when the entire clock signal is output to the first output terminal, to apply the first power source voltage to the gate electrode of the first transistor, such that the first transistor is turned off.

21. The scan driver as claimed in claim 10, wherein:
the plurality of scan driving blocks includes a first scan driving block and a second scan driving block,
a first input terminal of the first scan driving block is input with the first clock signal, a second input terminal of the first scan driving block is input with the second clock signal, and
a first input terminal of the second scan driving block is input with the second clock signal, and a second input terminal of the second scan driving block is input with the first clock signal.

22. The scan driver as claimed in claim 21, wherein:
the second clock signal is the signal for the first clock signal, shifted by 1 horizontal cycle.

23. The scan driver as claimed in claim 22, wherein:
the first scan driving block outputs the scan signal of a gate-on voltage by a duty of the second clock signal, and
the second scan driving block outputs the scan signal of a gate-on voltage by a duty of the first clock signal.

24. A display device, comprising:
a display unit including a plurality of pixels;
a data driver applying a data signal to a plurality of data lines connected to the plurality of pixels; and
a scan driver applying a scan signal to a plurality of scan lines connected to the plurality of pixels to apply the data signal to the plurality of pixels, the scan driver including a plurality of scan driving blocks, wherein:
each scan driving block of the plurality of scan driving blocks receives a first clock signal, a second clock signal, an entire clock signal, and a simultaneous light emitting control signal,
the plurality of scan driving blocks sequentially output the scan signal to the plurality of scan lines in synchronization with the first clock signal, and simultaneously output the scan signal to the plurality of scan lines according to a level of the simultaneous light emission control signal,
a first scan driving block among the plurality of scan driving blocks outputs the second clock signal as the first scan signal according to an input signal in synchronization with the first clock signal,
a second scan driving block, adjacent to the first scan driving block, outputs the first clock signal as the second scan signal according to the first scan signal in synchronization with the second clock signal, and
a first input terminal of the first scan driving block is input with the first clock signal, a second input terminal of the first scan driving block is input with the second clock signal, a first input terminal of the second scan driving block is input with the second clock signal, and a second input terminal of the second scan driving block is input with the first clock signal.

25. The display device as claimed in claim 24, wherein:
the input signal is a scan start signal or an output signal of a previous scan driving block.

26. The display device as claimed in claim 24, wherein:
when the first clock signal and the second clock signal are applied as a gate-off voltage and the simultaneous light emission control signal is applied as a gate-on voltage, the scan driver simultaneously outputs the scan signal to the plurality of scan lines.

27. The display device as claimed in claim 24, wherein:
when the first clock signal and the second clock signal are applied as a signal having a predetermined duty and the simultaneous light emission control signal is applied as a gate-off voltage, the scan driver sequentially outputs the scan signal to the plurality of scan lines.

28. A method of driving a scan driver that includes a plurality of scan driving blocks, including a first scan driving block and a second scan driving block, each scan block receiving a first clock signal, a second clock signal, an entire clock signal, and a simultaneous light emitting control signal, the method comprising:
outputting, simultaneously, scan signals from the plurality of scan driving blocks by applying the first clock signal and the second clock signal as a gate-off voltage and applying the simultaneous light emission control signal as a gate-on voltage to the plurality of scan driving blocks; and
outputting, sequentially, scan signals from the plurality of scan driving blocks by applying the simultaneous light emission control signal as a gate-off voltage and applying the first clock signal and the second clock signal having a predetermined duty to the plurality of scan driving blocks,
wherein outputting, sequentially, the scan signals includes:
outputting the second clock signal, having the predetermined duty, as a first scan signal according to an input signal, in synchronization with the first clock signal having the predetermined duty, and
outputting the first clock signal, having the predetermined duty, as a second scan signal according to the first scan signal, in synchronization with the second clock signal having the predetermined duty,
wherein the first clock signal is input to a first input terminal of the first scan driving block and a second input terminal of the second scan driving block, and the second clock signal is input to a second input terminal of the first scan driving block and a first input terminal of the second scan driving block.

29. The method as claimed in claim 28, wherein:
the input signal is a scan start signal or an output signal of a previous scan driving block.

30. The method as claimed in claim 29, wherein:
the second clock signal having the predetermined duty, is the signal for the first clock signal having the predetermined duty, shifted by the predetermined duty of the first clock signal.

* * * * *